(12) United States Patent
Hisamoto et al.

(10) Patent No.: US 7,723,779 B2
(45) Date of Patent: May 25, 2010

(54) INTEGRATED SEMICONDUCTOR NONVOLATILE STORAGE DEVICE

(75) Inventors: Digh Hisamoto, Kokubunji (JP); Shin'ichiro Kimura, Kunitachi (JP); Daiske Okada, Kunitachi (JP); Kan Yasui, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 289 days.

(21) Appl. No.: 11/437,610

(22) Filed: May 22, 2006

(65) Prior Publication Data

US 2006/0281262 A1 Dec. 14, 2006

(30) Foreign Application Priority Data

May 23, 2005 (JP) ............................. 2005-149296
May 9, 2006 (JP) ............................. 2006-129887

(51) Int. Cl.
*H01L 21/336* (2006.01)

(52) U.S. Cl. ..................... 257/324; 257/288; 257/368; 438/266; 438/267

(58) Field of Classification Search ............... 257/311, 257/314, 315, 316, 324, 326, E21.662, E21.679, 257/286, 319, E21.423, E29.309, 241, 405, 257/406, 411; 438/257–267, 286, 216, 197; 365/185.01, 185.28
See application file for complete search history.

(56) References Cited

U.S. PATENT DOCUMENTS

| | | | |
|---|---|---|---|
| 5,969,383 A | 10/1999 | Change et al. | 257/316 |
| 6,477,084 B1 | 11/2002 | Eitan | 365/185.18 |
| 2003/0198086 A1* | 10/2003 | Shukuri | 365/185.18 |
| 2004/0155234 A1* | 8/2004 | Ishimaru et al. | 257/10 |
| 2004/0241926 A1* | 12/2004 | Liou et al. | 438/200 |
| 2007/0155103 A1* | 7/2007 | Shukuri | 438/267 |

OTHER PUBLICATIONS

S. Sze, "Physics of Semiconductor Devices", 2nd edition, Wiley-Interscience Pub., p. 496-506.
S. Sze, "Physics of Semiconductor Devices", 2nd edition, Wiley-Interscience pub., p. 447.
Wei-Ming Chen et al., "A Novel Flash Memory Device with S Plit Gate Source Side Injection and ONO Charge Storage Stack (SPIN)", 1997 Symposium on VLSI Technology Digest of Technical Papers, p. 63-64.
A. T. Wu et al., "A Novel High-Speed, 5-Volt Programming Eprom Structure With Source-Side Injection", 1986 IEEE International Electron Device Meeting, Technical Digest, 1986, p. 584-587.
W.J. Tsai et al., "Data Retention Behavior of a SONOS Type Two-Bit Storage Flash Memory Cell" (2001 IEEE International Electron Device Meeting, Technical Digest, p. 719-722).

* cited by examiner

*Primary Examiner*—Steven Loke
*Assistant Examiner*—Suberr Chi
(74) *Attorney, Agent, or Firm*—Miles & Stockbridge P.C.

(57) ABSTRACT

An object of the present invention is to provide an integrated semiconductor nonvolatile storage device that can be read at high speed and reprogrammed an increased number of times.

In the case of conventional nonvolatile semiconductor storage devices having a split-gate structure, there is a tradeoff between the read current and the maximum allowable number of reprogramming operations. To overcome this problem, an integrated semiconductor nonvolatile storage device of the present invention is configured such that memory cells having different memory gate lengths are integrated on the same chip. This allows the device to be read at high speed and reprogrammed an increased number of times.

23 Claims, 33 Drawing Sheets

Prior Art

1 : SELECT TRANSISTOR   2 : MEMORY TRANSISTOR

Prior Art

Prior Art

Prior Art

DATA-FILE

CODE-FILE

FIG.22A

PROGRAM

| | $V_{mg}$ | $V_d$ | $V_s$ | $V_{cg}$ | $V_{bb}$ | PULSE WIDTH |
|---|---|---|---|---|---|---|
| CODE-FILE | 12 | 0 | 5 | 0.5 | 0 | 10 |
| DATA-FILE | 12 | 0 | 5 | 0.5 | 0 | 10 |

(UNIT V)      (UNIT $\mu$ sec)

FIG.22B

ERASE

| | $V_{mg}$ | $V_d$ | $V_s$ | $V_{cg}$ | $V_{bb}$ | PULSE WIDTH |
|---|---|---|---|---|---|---|
| CODE-FILE | -5 | open | 5 | 0 | 0 | 200 |
| DATA-FILE | -5 | open | 5 | 0 | 0 | 100 |

(UNIT V)      (UNIT $\mu$ sec)

FIG.22C

READ

| | Vmg | Vd | Vs | Vcg | Vbb | ACCESS TIME |
|---|---|---|---|---|---|---|
| CODE-FILE | 0 | 1.5 | 0 | 1.5 | 0 | 10 |
| DATA-FILE | 0 | 1.5 | 0 | 1.5 | 0 | 20 |

(UNIT V)　　　　　　　　(UNIT nsec)

FIG.23A

PROGRAM

| | Vmg | Vd | Vs | Vcg | Vbb | PULSE WIDTH |
|---|---|---|---|---|---|---|
| CODE-FILE | 12 | 0 | 5 | 0.5 | 0 | 10 |
| DATA-FILE | 12 | 0 | 5 | 0.5 | 0 | 10 |

(UNIT V)　　　　　　　　(UNIT $\mu$ sec)

FIG.23B

ERASE

| | Vmg | Vd | Vs | Vcg | Vbb | PULSE WIDTH |
|---|---|---|---|---|---|---|
| CODE-FILE | -8 | open | 5 | 0 | 0 | 100 |
| DATA-FILE | -5 | open | 5 | 0 | 0 | 100 |

(UNIT V)  (UNIT $\mu$ sec)

FIG.23C

READ

| | Vmg | Vd | Vs | Vcg | Vbb | ACCESS TIME |
|---|---|---|---|---|---|---|
| CODE-FILE | 0 | 1.5 | 0 | 1.5 | 0 | 10 |
| DATA-FILE | 0 | 1.5 | 0 | 1.5 | 0 | 20 |

(UNIT V)  (UNIT nsec)

FIG.24A

PROGRAM

| | Vmg | Vd | Vs | Vcg | Vbb | PULSE WIDTH |
|---|---|---|---|---|---|---|
| CODE-FILE | 12 | 0 | 5 | 0.5 | 0 | 10 |
| DATA-FILE | 12 | 0 | 5 | 0.5 | 0 | 10 |

(UNIT V)  (UNIT $\mu$ sec)

FIG.24B

ERASE

| | Vmg | Vd | Vs | Vcg | Vbb | PULSE WIDTH |
|---|---|---|---|---|---|---|
| CODE-FILE | −5 | open | 6 | 0 | 0 | 100 |
| DATA-FILE | −5 | open | 5 | 0 | 0 | 100 |

(UNIT V)  (UNIT $\mu$ sec)

FIG.24C

READ

| | Vmg | Vd | Vs | Vcg | Vbb | ACCESS TIME |
|---|---|---|---|---|---|---|
| CODE-FILE | 0 | 1.5 | 0 | 1.5 | 0 | 10 |
| DATA-FILE | 0 | 1.5 | 0 | 1.5 | 0 | 20 |

(UNIT V)  (UNIT nsec)

FIG.25A

PROGRAM

| | Vmg | Vd | Vs | Vcg | Vbb | PULSE WIDTH |
|---|---|---|---|---|---|---|
| CODE-FILE | 12 | 0 | 5 | 0.5 | 0 | 20 |
| DATA-FILE | 12 | 0 | 5 | 0.5 | 0 | 10 |

(UNIT V)  (UNIT $\mu$ sec)

FIG.25B

ERASE

| | Vmg | Vd | Vs | Vcg | Vbb | PULSE WIDTH |
|---|---|---|---|---|---|---|
| CODE-FILE | −5 | open | 5 | 0 | 0 | 200 |
| DATA-FILE | −5 | open | 5 | 0 | 0 | 100 |

(UNIT V)      (UNIT $\mu$ sec)

FIG.25C

READ

| | Vmg | Vd | Vs | Vcg | Vbb | ACCESS TIME |
|---|---|---|---|---|---|---|
| CODE-FILE | 0 | 1.5 | 0 | 1.5 | 0 | 10 |
| DATA-FILE | 0 | 1.5 | 0 | 1.5 | 0 | 20 |

(UNIT V)      (UNIT nsec)

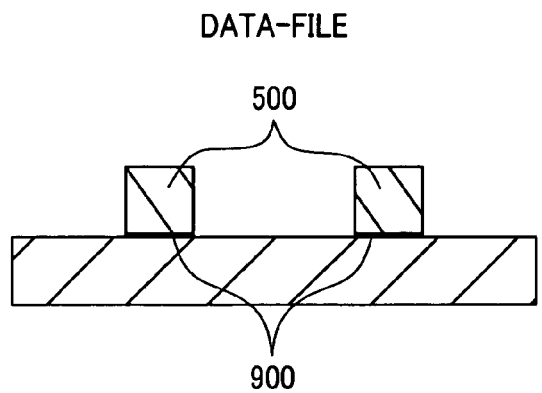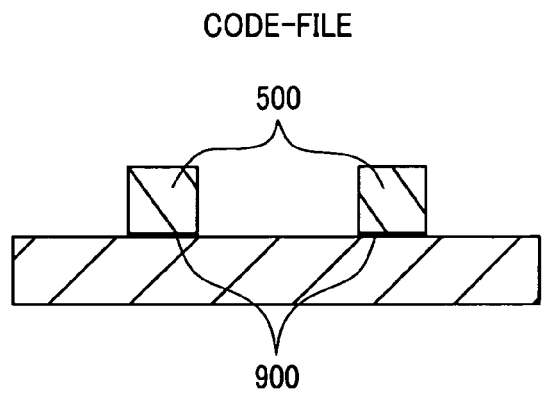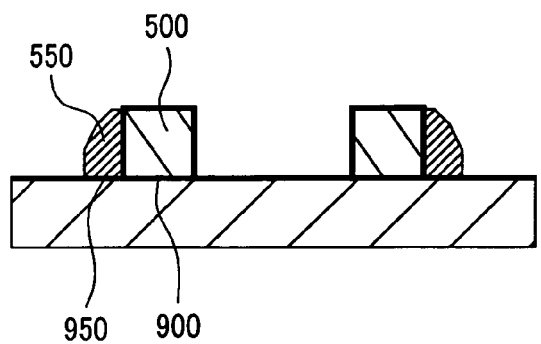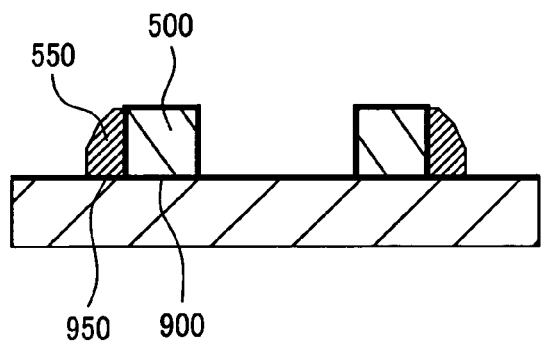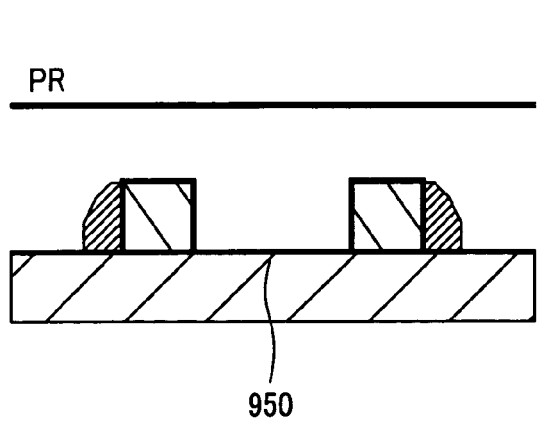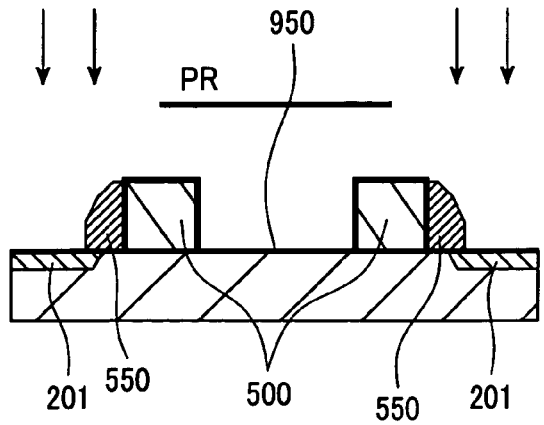

INTEGRATED SEMICONDUCTOR NONVOLATILE STORAGE DEVICE

CLAIM OF PRIORITY

The present application claims priority from Japanese application JP 2005-149296 filed on May 23, 2005 and Japanese application JP 2006-129887 filed on May 9, 2006, the contents of which are hereby incorporated by reference into this application.

FIELD OF THE INVENTION

The present invention relates to a semiconductor storage device with a nonvolatile memory structure that is stable in operation.

BACKGROUND ART

One of the built-in integrated semiconductor storage devices of an LSI is nonvolatile memory. This memory is very important in order to use the LSI in various applications, since it can retain stored data even after power to the LSI is removed.

Nonvolatile semiconductor memory devices employing a floating gate or an insulating film are described in, for example, S. Sze, "Physics of Semiconductor Devices", 2nd edition, Wiley-Interscience pub., p. 496-506 (Nonpatent Document 1). As is known in the art, unlike floating-gate nonvolatile memory, the type of nonvolatile memory in which an insulating film is laminated to store charges in the traps at the interface and in the insulating film does not require an additional conductive layer and hence can be formed in a manner matching the CMOS LSI process. However, this type of nonvolatile memory in which charges are retained within the insulating film must maintain sufficient charge retention characteristics while injecting or releasing charge, which is difficult to practically achieve.

On the other hand, it has been proposed that charge of opposite polarity may be injected to rewrite the stored data, instead of releasing the retained charge. The operation of such a nonvolatile memory device is described in 1997 Symposium on VLSI Technology, 1997, p. 63-64 (Nonpatent Document 3). In this memory, each cell includes two separate gates: a polysilicon gate for memory operation and a gate for memory cell selection. Further, similar memory devices are disclosed in U.S. Pat. No. 5,969,383 (Patent Document 1) and U.S. Pat. No. 6,477,084 (Patent Document 2).

In a memory cell structure disclosed in the above documents, two NMOS based transistors, namely a select transistor and a memory transistor, are disposed in a stacked arrangement and connected to each other. An equivalent circuit is shown in FIG. 1C. In FIG. 1C, a select transistor 1 and a memory transistor 2 are connected in series. FIGS. 1A and 1B show a plan view and a cross-sectional view, respectively, of the memory device or cell shown in FIG. 1C. Specifically, FIG. 1A shows the arrangement of a select gate pattern 1500, a memory gate pattern 1550, and an active region pattern 1150 on the substrate of the memory device. FIG. 1B shows a cross-sectional view of the memory device, as described above. Referring to FIG. 1B, a gate 500 of the select transistor (hereinafter referred to as a select gate 500) and a gate 550 of the memory transistor (hereinafter referred to as a memory gate 550) are formed on a semiconductor substrate 100. Diffusion layer electrodes 200 and 300 constituting the electrode portions of the memory device are formed in the semiconductor substrate 100. Further, a spacer insulator 940 is formed on a sidewall of each gate 500, 550, and diffusion layers 310 and 210 are formed in the semiconductor substrate 100. It should be noted that reference numeral 900 denotes the gate insulating film of the select transistor and 950 denotes the gate insulating film of the memory transistor.

According to the present invention, a gate namely, the memory gate may be formed in a process called a spacer process, as shown in FIG. 1B. In this process, after forming the gate 500 of the select transistor, the gate insulating film 950 of the memory gate 550 is formed. Then, after depositing a gate material of the memory gate 550 on the gate insulating film 950, the wafer is anisotropically etched in a direction perpendicular to its surface to form the memory gate 550 on a side of the select gate 500. This process is hereinafter referred to as a spacer process.

There will now be described the operation of a nonvolatile memory device according to the present invention. It should be noted that methods for forming a nonvolatile memory device according to the present invention will be described later in detail in connection with preferred embodiments of the present invention. FIG. 2 shows an array arrangement of memory cells (BIT1, BIT2) each represented by the equivalent circuit shown in FIG. 1C. In FIG. 2, the gates of the select transistors 1 of the first-row memory cells (BIT1, BIT2, and so on) constitute a word line SGL0, and the gates of the memory transistors 2 of the first-row memory cells constitute a word line MGL0; the gates of the select transistors 1 of the second-row memory cells (BIT1, BIT2, and so on) constitute a word line SGL1, and the gates of the memory transistors 2 of the second-row memory cells constitute a word line MGL1; the gates of the select transistors 1 of the third-row memory cells (BIT1, BIT2, and so on) constitute a word line SGL2, and the gates of the memory transistors 2 of the third-row memory cells constitute a word line MGL2; and so on. Further, the diffusion layers of the select transistors 1 of the first-column memory cells (BIT1) constitute a bit line BL0, and the diffusion layers of the memory transistors 2 of the first-column memory cells constitute a source line SL0; the diffusion layers of the select transistors 1 of the second-column memory cells (BIT2) constitute a bit line BL1, and the diffusion layers of the memory transistors 2 of the second-column memory cells constitute a source line SL1; and so on. The first-row memory cells (BIT1, BIT2, and so on) may be denoted collectively by reference numeral WORD1, and the second-row memory cells (BIT1, BIT2, and so on) may be denoted collectively by reference numeral WORD2, as shown in FIG. 2.

FIGS. 3 and 4 are schematic cross-sectional views of a memory cell portion, illustrating exemplary program or write and erase operations on the memory cell. These figures schematically show the memory cell structure and the program and erase operations and do not show the detailed structure. It should be noted that in FIGS. 3 and 4, components common to FIG. 1B are designated by the same reference numerals. The gate insulating film 950 of the memory gate has a structure in which a silicon nitride film is sandwiched between silicon oxide films; that is, it has the so-called MONOS (Metal-Oxide-Nitride-Oxide Semiconductor (silicon)) structure. The gate insulating film 900 of the select gate is a silicon oxide film. The diffusion layer electrodes 200 and 300 are formed using the select gate 500 and the memory gate 550 as masks.

There are 4 basic operations performed on this memory cell: (1) program, (2) erase, (3) retain, and (4) read. It should be noted that although the 4 basic operations are typically called in this way, other terms may be used to refer to them. Further, what is regarded as a program operation in one application may be regarded as an erase operation in another application, and vice versa. Although the following description only refers to exemplary operations, various operations may be performed on this memory cell. Further, although the following description assumes the memory cell to be an NMOS memory cell, it may be a PMOS memory cell (which may be formed and operated in the same manner as the NMOS memory cell).

(1) FIG. 3 schematically shows a program or write operation. A positive potential is applied to the diffusion layer electrode 200 on the memory gate side, and ground potential is applied to the substrate 100 and the diffusion layer electrode 300 on the select gate side. A gate overdrive voltage higher than the voltage of the substrate 100 is applied to the memory gate 550 to set the channel under the memory gate 550 to an "on" state. At that time, the potential of the select gate 500 is set 0.1-0.2 V higher than the threshold voltage to cause the channel to assume the "on" state. As a result, a conductive state is established to allow electrons to move, as shown in FIG. 3. Since in this state the highest electric field is produced around the boundary between the two gates, a number of hot electrons are generated and injected into the memory gate side. It should be noted that in FIG. 3, the white circle under the select gate 500 indicates an electron, a channel electron. This electron is accelerated to become a hot electron which is then injected into the MONOS film, as indicated by the arrow in the figure. Reference numeral 800 indicates generation of carriers due to impact ionization. The generated electron and hole, carriers, are indicated by a white circle and a shaded circle, respectively. This phenomenon is known as source side injection (SSI) and has been reported by, for example, A. T. Wu et al. (1986 IEEE International Electron Device Meeting, Technical Digest, 1986, p. 584-587 (Nonpatent Document 4)). The technique described above is directed to floating-gate memory cells. However, the injection mechanism also applies to "insulator film type" memory cells. This type of hot electron injection is characterized in that since the electric field is concentrated around the boundary between the select gate and the memory gate, the injection occurs predominantly at the select gate side portion of the memory gate. Further, unlike floating gate memory in which the charge retention layer is formed of electrodes, "insulator film type" memory retains charge within an insulating film. This means that in the case of "insulator film type" memory, electrons are retained within a very narrow region.

(2) FIG. 4 schematically shows an erase operation. A negative potential is applied to the memory gate 550 and a positive potential is applied to the diffusion layer electrode 200 on the memory gate side to cause strong inversion at the overlap between the memory gate and the diffusion layer. This leads to band-to-band tunneling, generating holes, as indicated by reference numeral 810 in the figure. Band-to-band tunneling is described by, for example, T. Y. Chan et al. (1987 IEEE International Electron Device Meeting, Technical Digest, p. 718-721 (Nonpatent Document 5)). In this memory cell, the generated holes are accelerated in the channel direction, attracted toward the memory gate by its bias, and thereby injected into the MONOS film, resulting in an erase operation. Reference numeral 820 indicates an electron-hole pair generated by a generated hole. These carriers are also injected into the MONOS film. That is, the threshold voltage of the memory gate that has been increased due to the negative charge of the injected electrons can be lowered by the positive charge of injected holes.

(3) When the memory cell is in the data retention state, the charge carriers injected into the MONOS insulating film are retained therein. Carriers move very little and very slowly within the insulating film, which allows them to be reliably retained without applying a voltage to the electrodes.

(4) When a read operation is performed on the memory cell, a positive potential is applied to the diffusion layer electrode 300 on the select gate side and a positive potential is applied to the select gate 500 to set the channel under the select gate to an "on" state. In this state, the data retained in the form of charge can be read as a current by applying a memory gate potential intermediate between the threshold voltages in the program or write and erase states.

[Patent Document 1]
U.S. Pat. No. 5,969,383

[Patent Document 2]
U.S. Pat. No. 6,477,084

[Nonpatent Document 1]
S. Sze, "Physics of Semiconductor Devices, $2^{nd}$ edition, Wiley-Interscience pub., p. 496-506

[Nonpatent Document 2]
S. Sze, "Physics of Semiconductor Devices", $2^{nd}$ edition, Wiley-Interscience pub., p. 447

[Nonpatent Document 3]
1997 Symposium on VLSI Technology, 1997, p. 63-64

[Nonpatent Document 4]
1986 IEEE International Electron Device Meeting, Technical Digest, 1986, p. 584-587

[Nonpatent Document 5]
1987 IEEE International Electron Device Meeting, Technical Digest, p. 718-721

[Nonpatent Document 6]
2001 IEEE International Electron Device Meeting, Technical Digest, p. 719-722

DISCLOSURE OF THE INVENTION

Increasing the cell current of this memory cell is effective in enabling high-speed operation of a memory chip or a memory module employing the cell. As shown in FIG. 1C, this memory cell is made up of two transistors: the select transistor 1 and the memory transistor 2. A common MOS transistor can be used as the select transistor 1. This means that the select transistor 1 may have a high performance device structure highly optimized for the manufacturing process. Therefore, to increase the cell current, it is important to enhance the performance of the memory transistor 2. Increasing the current drive in a MOS transistor requires a reduction in the thickness of the gate insulating film or in the channel length if the same voltage conditions are applied to the transistor. However, since the gate insulating film functions as the charge retention portion, the reduction in its thickness must be limited in order to achieve satisfactory memory characteristics. Therefore, reducing the channel length is most effective in increasing the current drive. The channel length is the gate length minus the overlap length between the gate and the diffusion layer, as described later (see FIG. 21A).

The memory gate structure shown in FIG. 1B formed by the so-called spacer process may be effective in reducing the channel length of a memory gate. The gate length of a memory gate formed by this process depends on the deposition thickness of the memory gate material. Therefore, this process allows formation of a gate having a gate length smaller than the minimum lithographic dimension of general lithographic technology, resulting in reduced channel length and hence increased current drive, as shown in FIG. 5. FIG. 5 shows the relationship between the memory gate bias and the read current for several memory gate lengths (Lmg). Specifically, FIG. 5 compares the current drive levels obtained when the gate length is set to 50 nm, 60 nm, and 70 nm with a minimum lithographic dimension of 130 nm. The figure indicates that the current drive can be increased by reducing the gate length.

In the case of a memory cell utilizing hole injection, such injection damages the insulating film and its interface, as is known in the art. This results in degradation in the charge retention characteristics. Specifically, interface states and traps are formed due to injection of hot carriers. As a result, charge carriers are delivered to or from, or through, these interface states and traps. The damaged portions undergo "charge desorption", resulting in a change in the threshold voltage. Therefore, if the gate length of the memory gate is short, the change in the threshold voltage is large since "charge desorption" occurs over the entire channel area. FIG. 6 shows the relationship between the interface state intensity and the shift in the threshold voltage for two channel lengths (20 nm, 40 nm) with the same damaged layer width. The horizontal axis represents the interface state intensity, and the vertical axis represents the shift in the threshold voltage. As can be seen from the figure, the memory cell having the shorter channel length exhibits a larger threshold voltage shift. That is, the shorter the channel length, the larger the shift in the threshold voltage due to damage to the insulating film and its interface.

The present invention has been devised to solve the above problems. It is, therefore, an object of the present invention to provide an integrated semiconductor nonvolatile storage device employing nonvolatile memory devices that allow for high performance and stable operation.

Nonvolatile memory devices used in integrated semiconductor devices are broadly divided into two types depending on the requirements of the system: those adapted to be read at high speed and those adapted to be reprogrammed repeatedly. A typical example of the former is a memory device called a code file, which is used to store processing programs. A typical example of the latter, on the other hand, is a memory device called a data file, which is used to store data. The code file is required to perform a read operation at high speed, while the data file is required to allow a number of reprogramming operations. In the following description, a memory cell portion that must operate at high speed is also referred to as a code file, and a memory cell portion that must allow for a number of reprogramming operations is also referred to as a data file.

With conventional nonvolatile memory devices, there is a tradeoff between the maximum allowable number of reprogramming operations, that is, damage resistance and the read speed, that is, current drive, as described above. Therefore, a nonvolatile memory device may have one of the following chip configurations depending on the application. In one chip configuration, a code file nonvolatile memory chip and a data file nonvolatile memory chip are provided separately from the processing chip, as shown in FIG. 7. In another configuration, the chip having a processing function includes code file nonvolatile memory, and a data file nonvolatile memory chip is separately provided, as shown in FIG. 8.

Some control systems require a data file memory space which is small but subjected to a number of reprogramming operations. In such a case, they may employ a chip configuration in which the chip having a processing function includes data file memory, and a code file nonvolatile memory chip is separately provided, as shown in FIG. 9.

The characteristics of a split-gate memory cell of the present invention can be changed by changing the gate length of its memory gate, as described above. Therefore, according to the present invention, memory cells having different memory gate channel lengths are formed on the same chip to produce a single integrated semiconductor device by using various manufacturing processes described later in connection with preferred embodiments of the present invention. More specifically, memory cells that must be read at high speed have a shorter memory gate channel length, while those that must be reprogrammed many times have a longer memory gate channel length. These two types of memory cells are integrated on the same chip.

Thus, according to the present invention, memory cells adapted to be read at high speed and memory cells adapted to be reprogrammed many times are integrated on the same chip. With this arrangement, the prevent invention can provide an integrated semiconductor nonvolatile storage device adapted for both high-speed read operation and repeated reprogramming.

BRIEF DESCRIPTION OF THE DRAWINGS

FIG. 22A is a diagram showing programming conditions.
FIG. 22B is a diagram showing erase conditions.
FIG. 22C is a diagram showing read conditions.
FIG. 23A is a diagram showing programming conditions.
FIG. 23B is a diagram showing erase conditions.
FIG. 23C is a diagram showing read conditions.
FIG. 24A is a diagram showing programming conditions.
FIG. 24B is a diagram showing erase conditions.
FIG. 24C is a diagram showing read conditions.
FIG. 25A is a diagram showing programming conditions.
FIG. 25B is a diagram showing erase conditions.
FIG. 25C is a diagram showing read conditions.

FIGS. 34 to 41 are cross-sectional structural views illustrating sequential process steps for forming a device according to a third embodiment of the present invention.

BEST MODES OF CARRYING OUT THE INVENTION

First Embodiment

Figure 10:
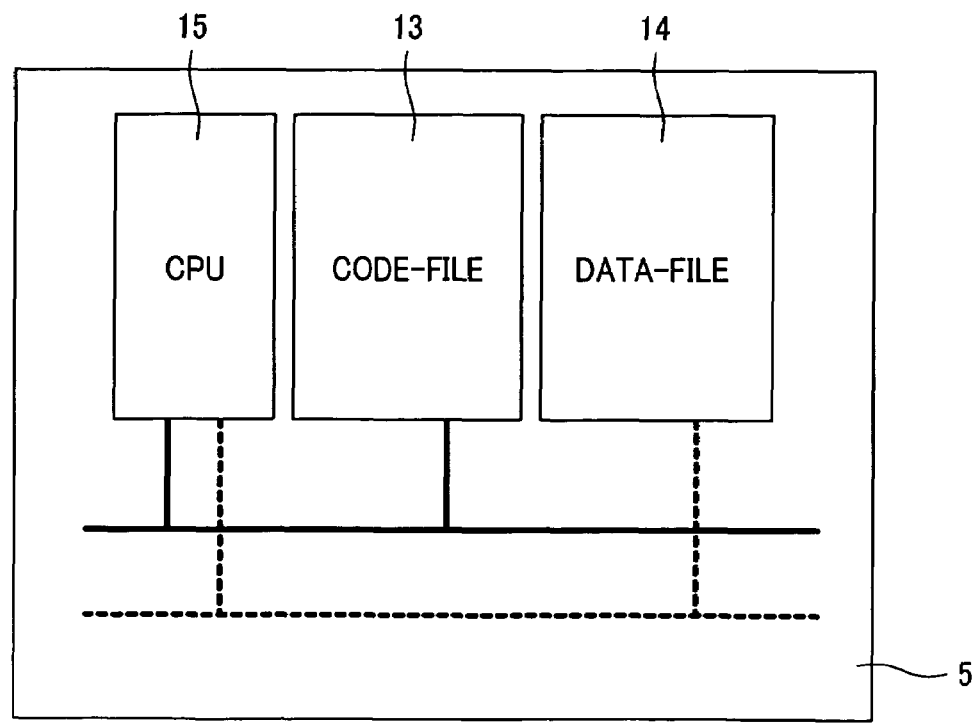
FIG. 10 is a diagram showing the configuration of a chip including a plurality of memory files.

There will now be described an exemplary memory cell forming process according to the present invention, illustrating the structures of the memory cells at each process step. FIG. 10 is a diagram showing the overall configuration of an integrated semiconductor device according to a first embodiment of the present invention. Referring to the figure, a code file portion 13 that must be read at high speed and a data file portion 14 that must be reprogrammed repeatedly are connected to a processing circuit portion or CPU 15. These components are formed on the same chip 5. FIG. 10 only shows the CPU 15 and the nonvolatile memory portions 13 and 14 to which the present invention is directed. However, the integrated semiconductor device also includes cache memory, general memory, I/O portions, and other necessary regions. These components have been omitted from the figure for clarity of explanation.

Figure 11:
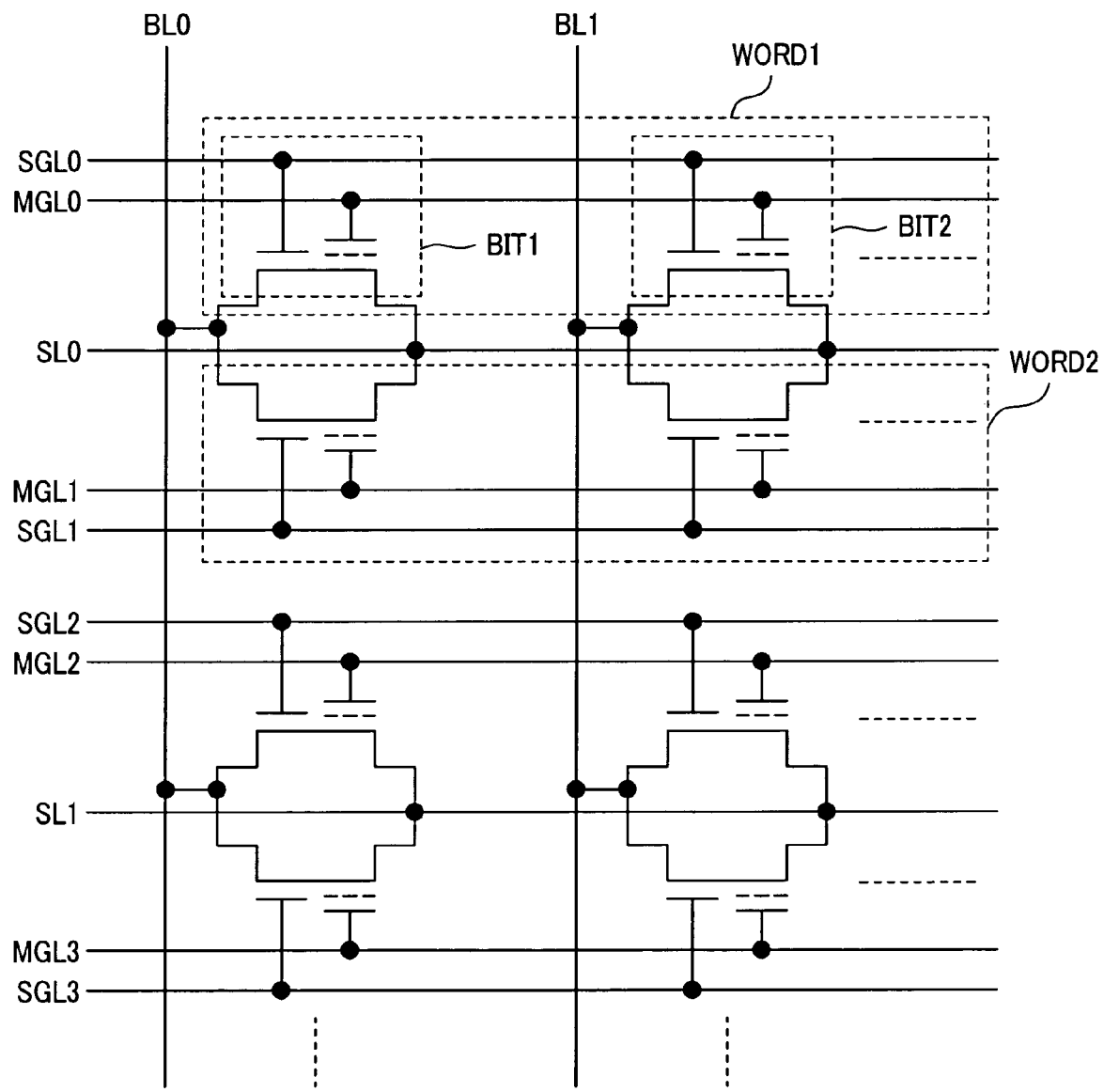
FIG. 11 is an equivalent circuit diagram of a memory array.
Figure 12:
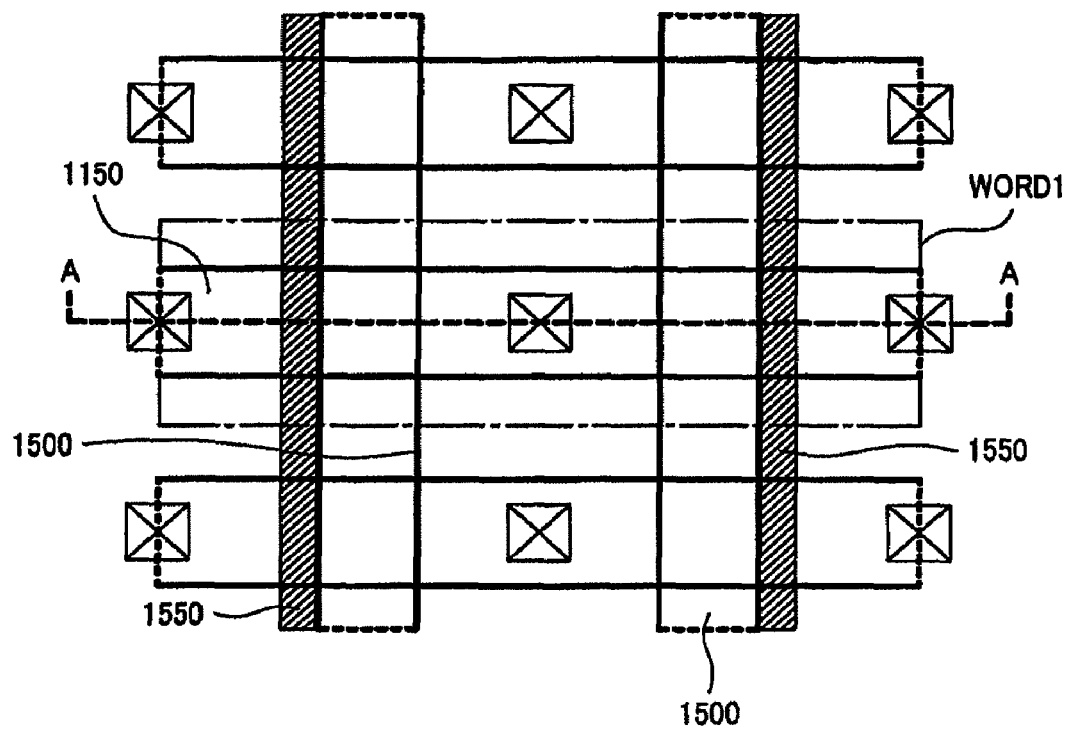
FIG. 12 is a plan view showing the layout of the memory array.
Figure 13A:
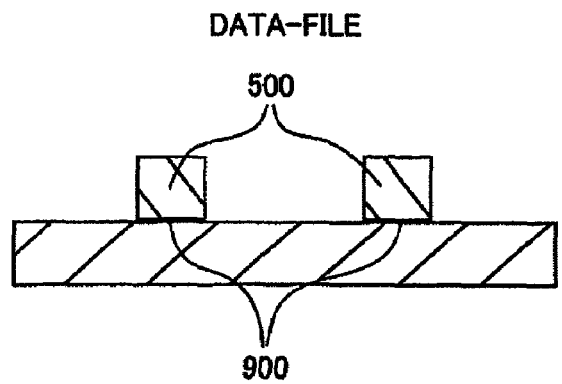
FIGS. 13 to 20 are cross-sectional structural views illustrating sequential process steps for forming a device according to a first embodiment of the present invention.
Figure 13B:
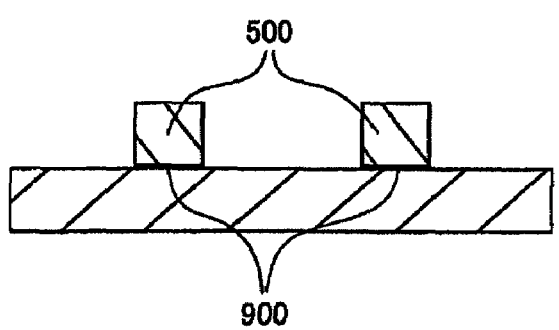
Figure 14A:
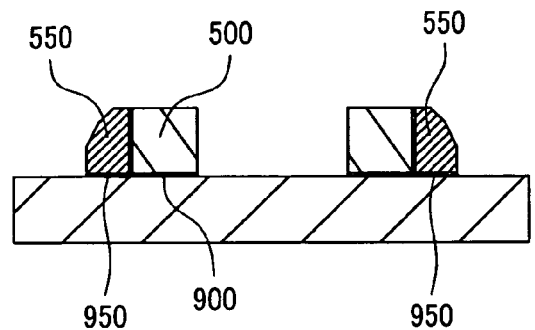
Figure 14B:
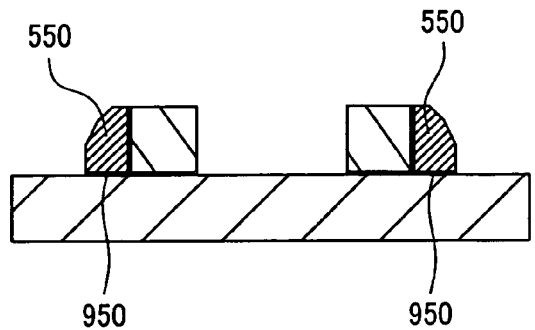

FIGS. 11 to 20 are various schematic diagrams illustrating a memory cell array of the semiconductor device according to the first embodiment of the present invention. FIG. 11 is an equivalent circuit diagram of the memory cell array; FIG. 12 is a plan view showing the layout of the memory cell array; and FIGS. 13 to 20 are cross-sectional views showing sequential process steps for forming the memory cell array. In each of FIGS. 13 to 20, the illustration (a) on the left-hand side is a cross-sectional view of data file cells, and the illustration (b) on the right-hand side is a cross-sectional view of code file cells. These cross-sectional views are taken along line A-A of FIG. 12 in the channel direction. It should be noted that the illustrations (a) and (b) only show the principal transistors of a memory cell portion. According to the present invention, the code file portion and the data file portion can be designed to have the same array layout viewed in plan. Therefore, the present embodiment will be described with reference to the layout shown in FIG. 12. Further, the following memory cell forming process is assumed to be a process for 0.13 μm generation semiconductor devices.

First, an active region and device isolation regions are formed in the surface of a semiconductor substrate by a common shallow trench isolation (STI) process. It should be noted that these device isolation regions are not shown in the figures. Then, after exposing the silicon surface at the active region, the substrate surface 100 is thermally oxidized to form a gate insulating film 900 having a thickness of 2.5 nm, and a polysilicon layer is deposited to a thickness of 200 nm by a CVD technique. Then, after patterning the top surface by use of a select gate pattern (denoted by reference numeral 1500 in FIG. 12), the polysilicon layer is etched to form select gate electrodes 500, as shown in illustrations (a) and (b) of FIG. 13. Though not shown, the gate electrodes in the processing circuit portion (CPU) may be formed at the same time as the above select gate electrodes.

Then, after removing the portions of the gate insulating film 900 on the memory gate regions, the exposed substrate surfaces are oxidized to a depth of 4 nm to form an oxide film 951. Then, by a CVD technique, a silicon nitride film 952 is deposited to a thickness of 8 nm, and a silicon oxide film 953 is deposited on the silicon nitride film 953 to a thickness of 7 nm, forming an ONO film 950, as shown in illustrations (a) and (b) of FIG. 14. That is, the ONO film 950 is a film stack made up of the oxide film 951, the silicon nitride film 952, and the silicon oxide film 953. It should be noted that the ONO film can also be formed by an in-situ steam generation (ISSG) oxidation technique. That is, the substrate surface is ISSG-oxidized to a depth of 5 nm. Then, a silicon nitride film is deposited to a thickness of 14 nm and ISSG-oxidized to form an upper oxide film having a thickness of 6 nm.

After thus forming the ONO film 950, a polysilicon layer is deposited to a thickness of 70 nm. This polysilicon layer is doped with phosphorous to a high concentration in situ. This polysilicon layer is anisotropically etched to form a spacer-shaped memory gate 550 on a side of each select gate 500. At that time, the contact forming portions may be masked with a photoresist pattern. Though not shown, additional etching may be performed to remove unwanted portions of the polysilicon 550 from the sides of the select gates.

According to the present embodiment, since the memory gates 550 are formed on only one side of each select gate 500, the unwanted portions of the polysilicon 550 are removed by etching. At that time, the ONO film 950 can be used as a protective film for protecting the underlayer. After etching off the exposed portions of the ONO film, the substrate surface is cleaned and then thermally oxidized to form an oxide film having a thickness of 2 nm. This oxide film is not shown in the figure, since it is substantially removed in subsequent steps. For example, in the step shown in FIG. 18, the oxide film is substantially removed by surface cleaning.

Figure 15A:
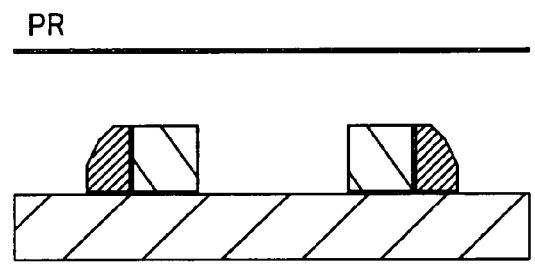
Figure 15B:
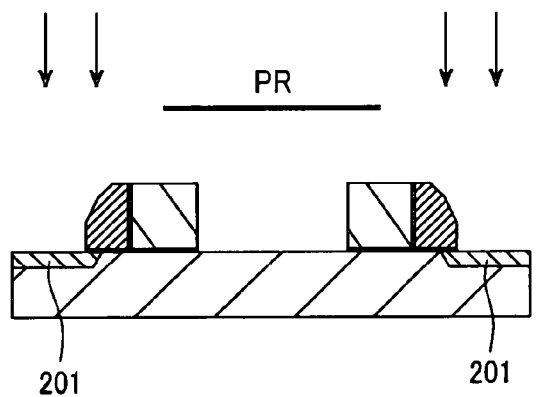

Then, a mask layer PR or a photoresist layer is formed, and arsenic is ion-implanted in the diffusion layer region on the memory gate 550 side of each memory cell in the code file portion at 10 KeV to a dose amount of $10^{15}$ cm$^{-2}$ to form sources (diffusion layer electrodes) 201, as shown in FIG. 15. It should be noted that each mask layer formed of a photoresist is hereinafter denoted by symbol PR.

Figure 16A:
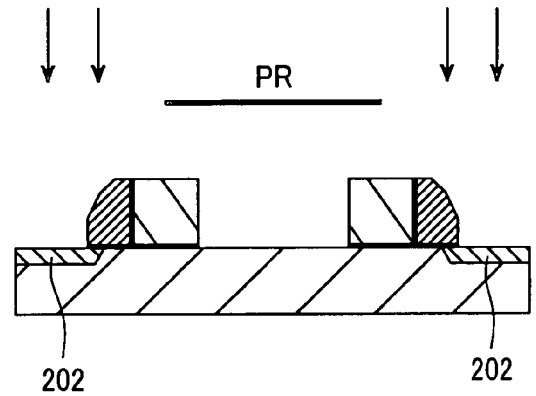
Figure 16B:
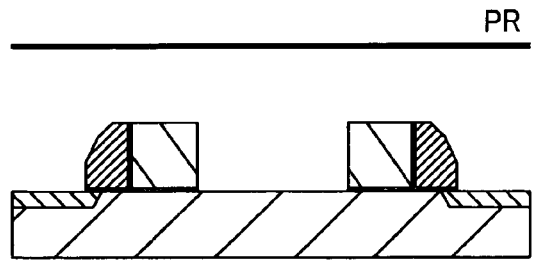

Then, a new mask layer PR or a photoresist layer is formed, and arsenic is ion-implanted in the diffusion layer region on the memory gate 550 side of each memory cell in the data file portion at 3 KeV to a dose amount of $10^{15}$ cm$^{-2}$ to form sources (diffusion layer electrodes) 202, as shown in FIG. 16.

Figure 17A:
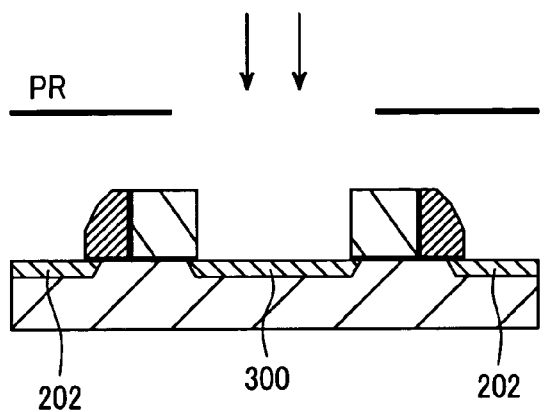
Figure 17B:
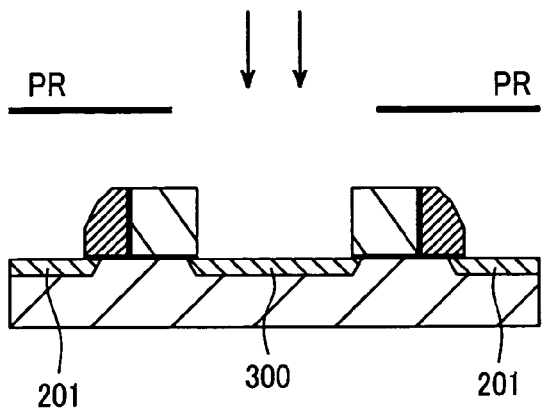

Then, another new mask layer PR or a photoresist layer is formed, and arsenic is ion-implanted in the diffusion layer region on the select gate 500 side of each memory cell in the data file portion and the code file portion at 5 KeV to a dose amount of $8\times10^{14}$ cm$^{-2}$ to form drains (diffusion layer electrodes) 300, as shown in FIG. 17. According to the present embodiment, each two memory cell portions in a side-by-side arrangement use the same drain region 300 as their drains. The formation of these drains may be combined with the above two source diffusion layer forming processes, as necessary. Further, the diffusion layers in the processing circuit portion (CPU) may be formed at the same time as the above drains.

Figure 18A:
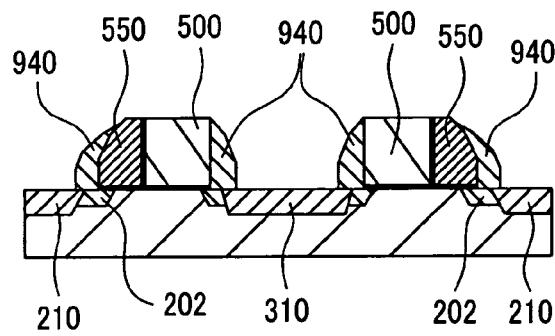
Figure 18B:
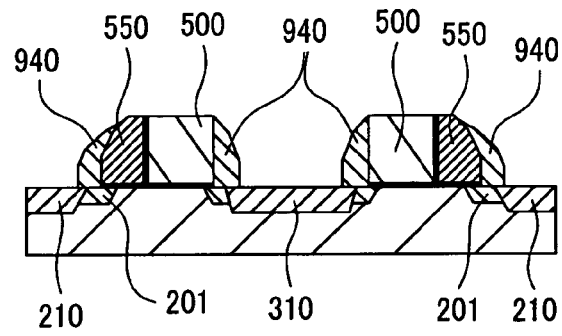

Then, before forming a spacer, the semiconductor substrate 100 thus processed is cleaned. In this step, most of the oxide film formed on the surface is removed, as described above. Then, a silicon oxide film is newly deposited to a thickness of 100 nm. This silicon oxide film is anisotropically etched to form a spacer 940 on a side of each select gate 500 and a side of each memory gate 550. Then, arsenic is ion-implanted using these spacers 940 as masks to form diffusion layers 210 and 310, as shown in FIG. 18. It should be noted that the select gates 500 may be doped with an impurity at the same time with the above impurity doping. These processes are common lightly-doped drain (LDD) processes.

Figure 19A:
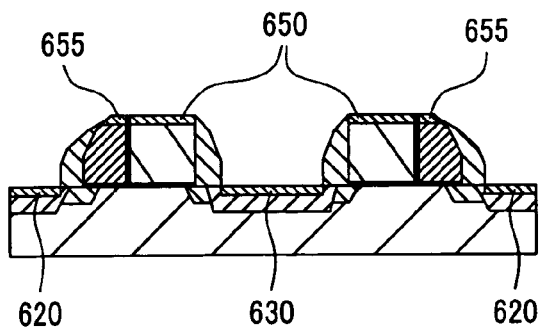
Figure 19B:
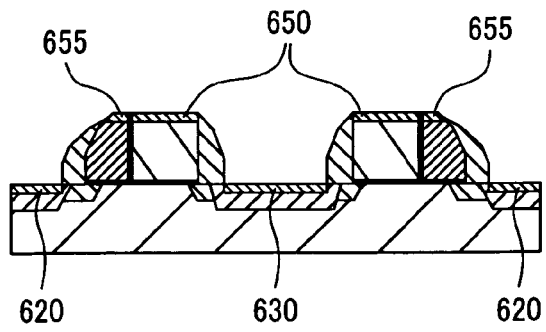

Then, silicide layers 650, 655, 620, and 630 are formed on the select gates, the memory gates, the source diffusion layers and the drain diffusion layers, respectively, by a common salicide process, as shown in FIG. 19. Specifically, this salicide process covers the sides of the polysilicon gates with spacer insulators, and selectively silicides the exposed top surfaces of the gates and the source and drain diffusion layer regions formed in the silicon substrate. Thus, the top surfaces of the select gates and the memory gates are silicided at once.

Figure 20A:
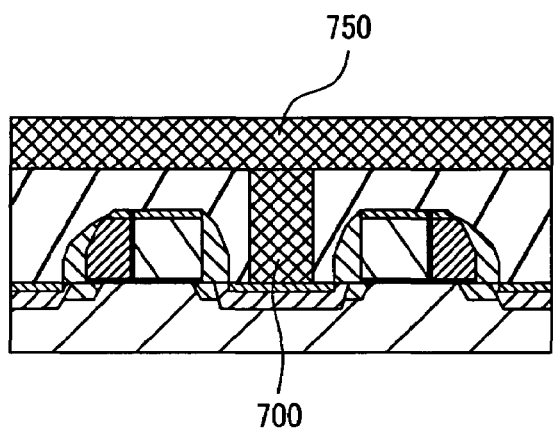
Figure 20B:
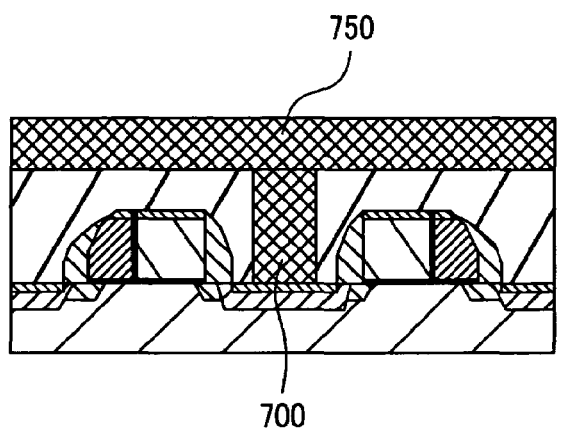

Then, a common wiring process for CMOS devices is used to complete the memory cells, as shown in FIG. 20. In FIG. 20, reference numeral 700 denotes a contact plug and 750 denotes a first metal wiring layer.

Figure 21A:
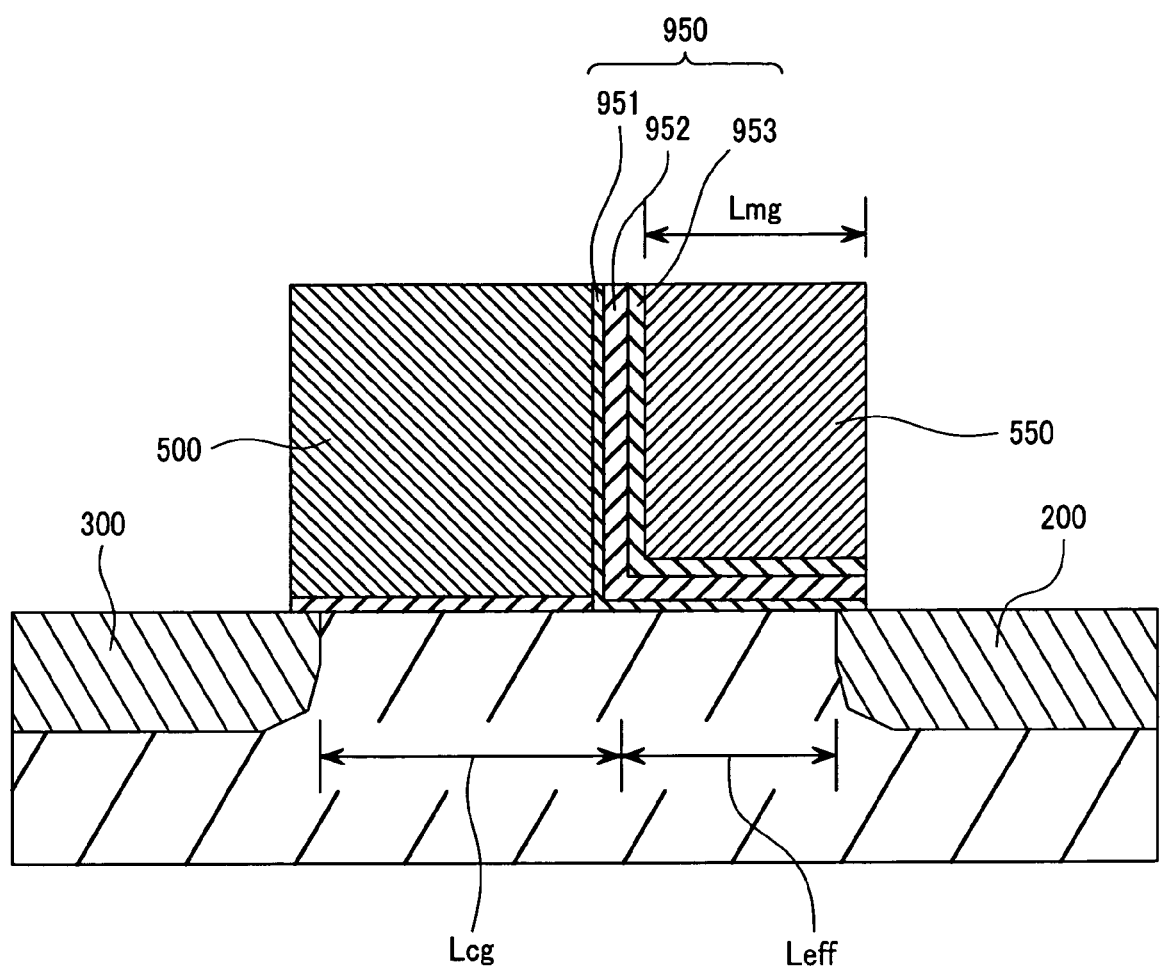
FIG. 21A is a cross-sectional structural view illustrating the effect of the first embodiment.
Figure 21B:
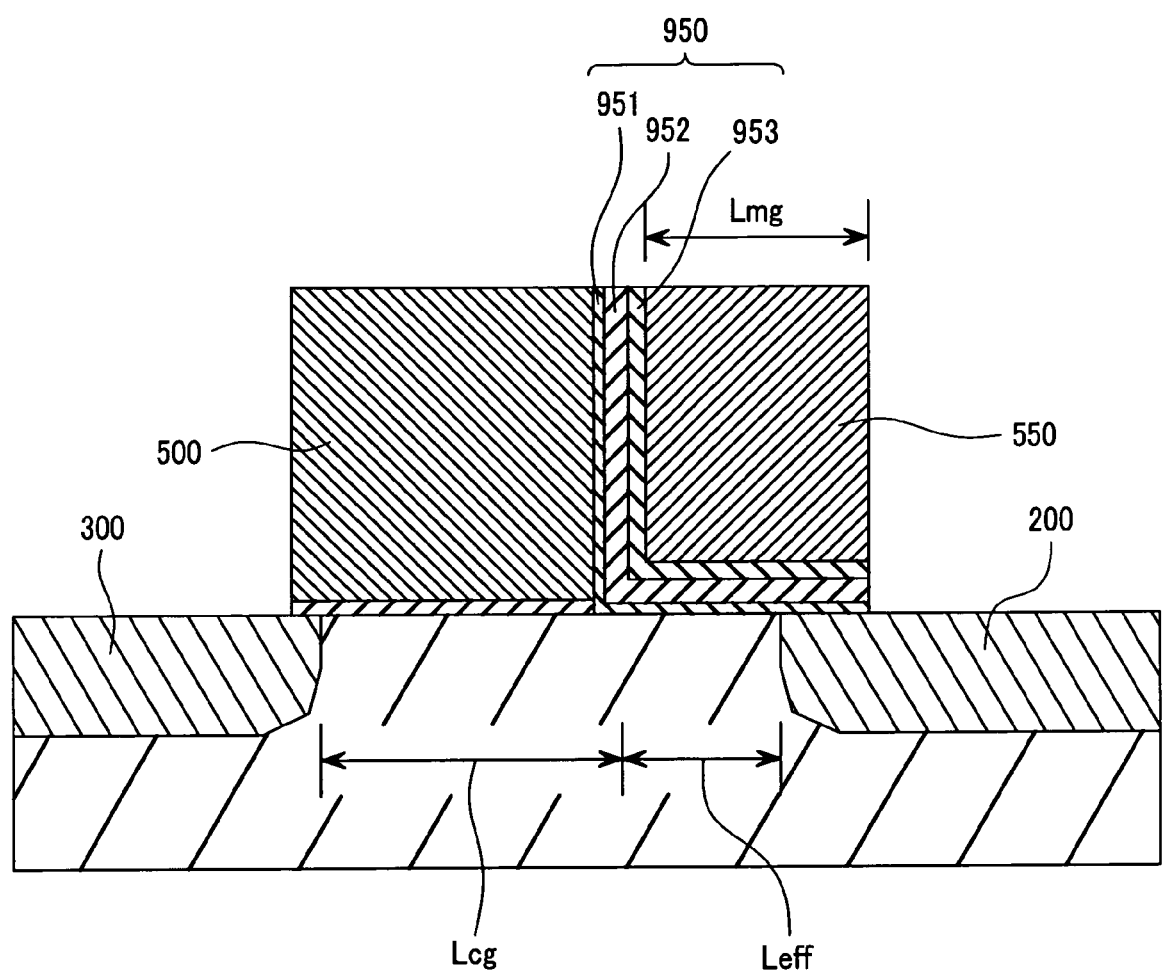
FIG. 21B is another cross-sectional structural view illustrating the effect of the first embodiment.

In the above manufacturing process, the memory-gate-side diffusion layer regions in the code file portion are ion-implanted at higher energy than the memory-gate-side diffusion layer regions in the data file portion. Therefore, the memory-gate-side diffusion layer regions in the code file portion extend under their respective gates a larger distance than the memory-gate-side diffusion layer regions in the data file portion. As a result, the memory gate of each memory cell in the code file portion has a shorter effective channel length. FIG. 21A is a cross-sectional view of a major portion of a memory cell in the data file portion, and FIG. 21B is a cross-sectional view of a major portion of a memory cell in the code file portion. In FIGS. 21A and 21B, components common to the above figures are designated by the same reference numerals. As can be seen by comparison between FIGS. 21A and 21B, these memory cells have the same memory gate length (Lmg) but different memory gate channel lengths (Leff). It should be noted that reference numeral Lcg denotes a select gate channel length.

Since the data file portion can be read at lower speed than the code file portion, different programming and erase conditions may be applied to the data file portion than those applied to the code file portion. FIGS. 22A, 22B, and 22C show typical programming, erase, and read conditions. In these figures, Vmg is memory gate voltage; Vd, bit line voltage; Vs, source line voltage; Vcg, select gate voltage; and Vbb, substrate potential.

In the code file portion, which must be read at high speed, an erase operation is performed so as to produce a lower threshold voltage, as compared to an erase operation in the data file portion. In FIGS. 22A, 22B, and 22C, this is achieved by increasing the width of the erase pulse. However, the memory gate voltage (Vmg) in the code file portion may be reduced as shown in FIGS. 23A, 23B, and 23C, or the diffusion layer voltage (Vs) in the code file portion may be increased as shown in FIGS. 24A, 24B, and 24C to achieve the same effect. These arrangements allow a read operation to be performed at higher speed using the same peripheral read circuit. Further, the conditions shown in FIGS. 25A, 25B, and 25C also lead to a read operation at higher speed.

Second Embodiment

A second embodiment of the present invention will now be described with reference to FIGS. 26 to 33. These figures are cross-sectional views showing sequential process steps for forming a memory cell array. In each of FIGS. 26 to 33, the illustration (a) on the left-hand side is a cross-sectional view of data file cells, and the illustration (b) on the right-hand side is a cross-sectional view of code file cells. These cross-sectional views are taken along line A-A of FIG. 12 in the channel direction. According to the present invention, the code file portion and the data file portion can be designed to have the same array layout viewed in plan. Therefore, the present embodiment will be described with reference to the layout shown in FIG. 12.

Figure 26A:
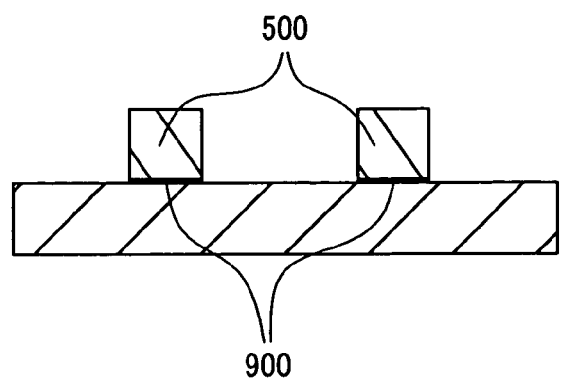
FIGS. 26 to 33 are cross-sectional structural views illustrating sequential process steps for forming a device according to a second embodiment of the present invention.
Figure 26B:
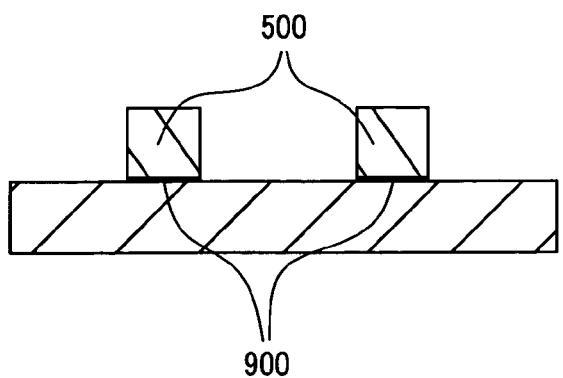

First, an active region and device isolation regions are formed in the surface of a semiconductor substrate by a common shallow trench isolation (STI) process. It should be noted that these device isolation regions are not shown in the figures. Then, after exposing the silicon surface at the active region, the substrate surface is thermally oxidized to form a gate insulating film 900 having a thickness of 2.5 nm. After that, a polysilicon layer 500 is deposited to a thickness of 200 nm by a CVD technique. Then, after patterning the top surface by use of a select gate pattern (denoted by reference numeral 1500 in FIG. 12), the polysilicon layer is etched to form select gate electrodes 500, as shown in FIG. 26. Though not shown, the gate electrodes in the processing circuit portion (CPU) may be formed at the same time as the above select gate electrodes 500.

Figure 27A:
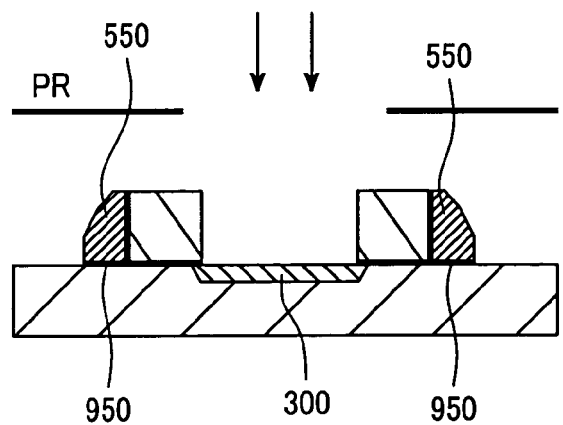
Figure 27B:
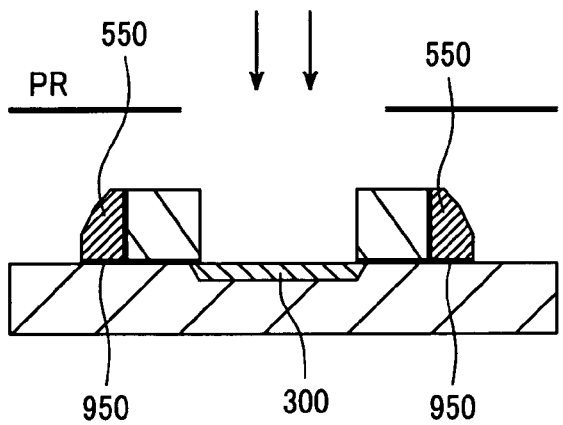

Then, after removing the portions of the gate insulating film 900 on the memory gate regions, the exposed substrate surfaces are oxidized to a depth of 4 nm. Then, by a CVD technique, a silicon nitride film is deposited on the top surface to a thickness of 8 nm, and a silicon oxide film is deposited on the silicon nitride film to a thickness of 7 nm, forming an ONO film, as shown in FIG. 27. It should be noted that the ONO film can also be formed by an in-situ steam generation (ISSG) oxidation technique. That is, the substrate surface is ISSG-oxidized to form a silicon oxide film having a thickness of 5 nm. Then, a silicon nitride film is deposited to a thickness of 14 nm and ISSG-oxidized to form an upper oxide film having a thickness of 6 nm.

After thus forming the ONO film 950, a polysilicon layer is deposited to a thickness of 70 nm. This polysilicon layer is doped with phosphorous to a high concentration in situ. This polysilicon layer is anisotropically etched to form a spacer-shaped memory gate 550 on a side of each select gate 500. At that time, the contact forming portions may be masked with a photoresist pattern. Though not shown, additional etching may be performed to remove unwanted portions of the polysilicon 550 from the sides of the select gates.

According to the present embodiment, since the memory gates 550 are formed on only one side of each select gate 500, the unwanted portions of the polysilicon 550 are removed by etching. At that time, the ONO film 950 can be used as a protective film for protecting the underlayer. After etching off the exposed portions of the ONO film, the substrate surface is cleaned and then thermally oxidized to form an oxide film having a thickness of 2 nm. This oxide is not shown in the figure, since it is substantially removed in subsequent steps.

Then, a mask layer PR or a photoresist layer is formed, and arsenic is ion-implanted in the diffusion layer region on the select gate side of each memory cell in the code file portion and the data file portion at 5 KeV to a dose amount of $8 \times 10^{14}$ cm$^{-2}$ to form drains 300. The formation of these drains may be combined with two source diffusion layer forming processes, as necessary. Further, the diffusion layers in the processing circuit portion (CPU) may be formed at the same time as the above drains.

Figure 28A:
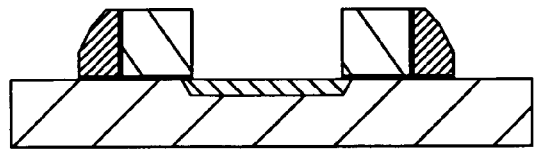
Figure 28B:
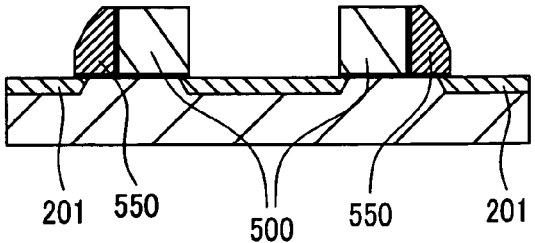

Then, a new mask layer PR or a photoresist layer is formed, and arsenic is ion-implanted in the diffusion layer region on the memory gate side of each memory cell in the code file portion at 5 KeV to a dose amount of $8 \times 10^{15}$ cm$^{-2}$ to form sources 201, as shown in FIG. 28.

Figure 29A:
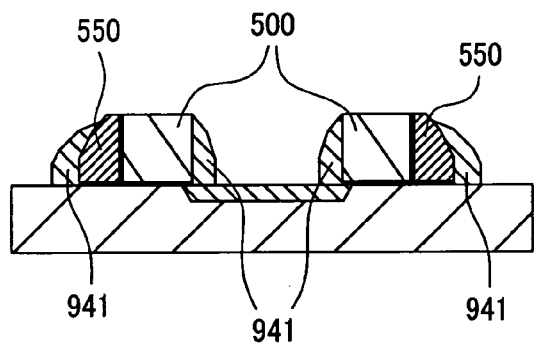
Figure 29B:
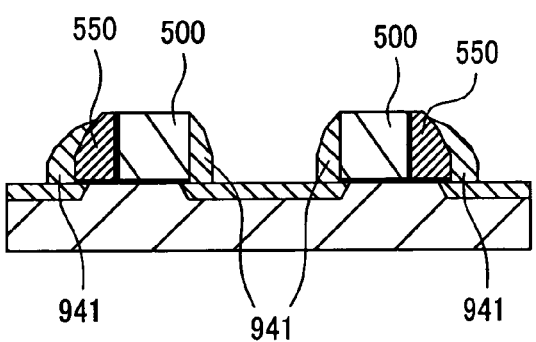

Then, a silicon oxide film is deposited to a thickness of 20 nm and anisotropically etched to form a spacer 941 on a side of each select gate 500 and a side of each memory gate 550, as shown in FIG. 29.

Figure 30A:
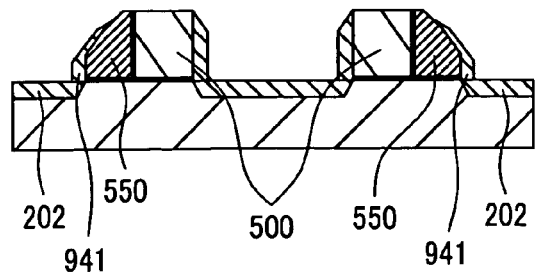
Figure 30B:
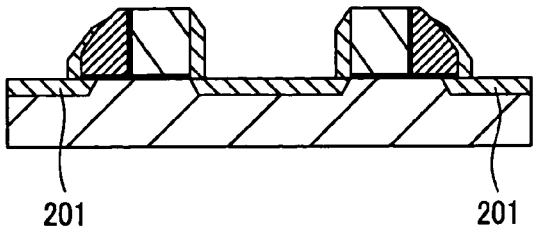

Then, another mask layer PR or a photoresist layer is formed, and arsenic is ion-implanted in the diffusion layer region on the memory gate side of each memory cell in the data file portion at 5 KeV to a dose amount $10^{15}$ cm$^{-2}$ to form sources 202, as shown in FIG. 30.

Figure 31A:
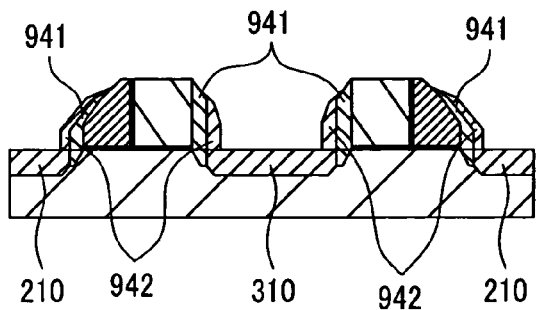
Figure 31B:
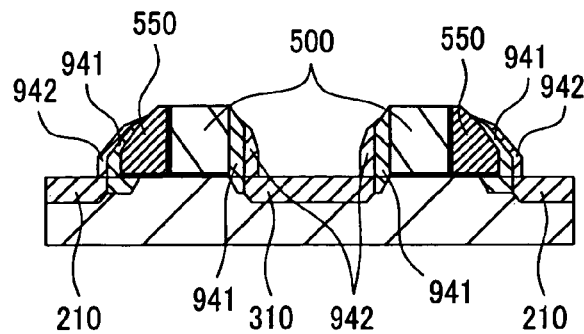

Then, a silicon oxide film is deposited to a thickness of 100 nm. This silicon oxide film is anisotropically etched to form a spacer 942 on a side of each select gate 500 and a side of each memory gate 550. Then, arsenic is ion-implanted using these spacers 942 as masks to form diffusion layers 210 and 310, as shown in FIG. 31. It should be noted that the select gates 500 may be doped with an impurity at the same time with the above impurity doping. These processes are common lightly-doped drain (LDD) processes.

Figure 32A:
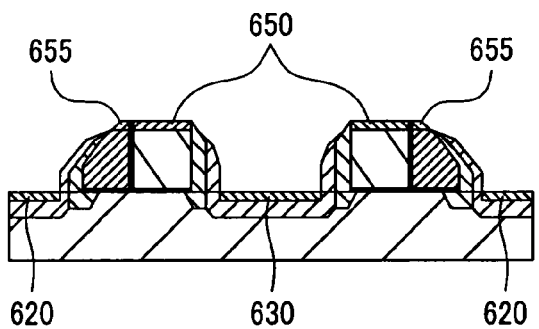
Figure 32B:
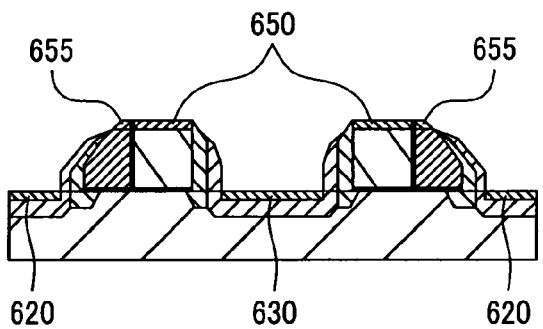

Then, silicide layers 650, 655, 620, and 630 are formed on the select gates, the memory gates, the source diffusion layers, and the drain diffusion layers, respectively, by a common salicide process, as shown in FIG. 32.

Figure 33A:
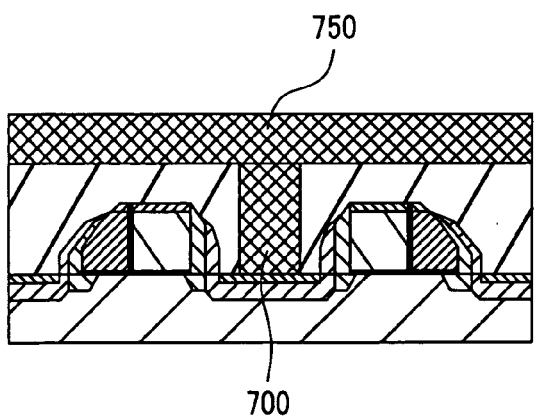
Figure 33B:
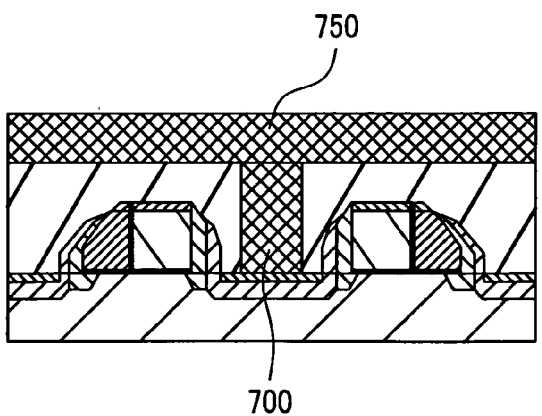

Then, a common wiring process for CMOS devices is used to complete the memory cells, as shown in FIG. 33. In FIG. 33, reference numeral 700 denotes a contact plug and 750 denotes a first metal wiring layer.

The above manufacturing process allows the memory-gate-side diffusion layer regions in the data file portion having a double spacer arrangement to extend under their respective gates a smaller distance than the memory-gate-side diffusion layer regions in the code file portion. As a result, the memory gate of each memory cell in the data file portion has a longer effective channel length.

Third Embodiment

A third embodiment of the present invention will now be described with reference to FIGS. 34 to 42. These figures are cross-sectional views showing sequential process steps for manufacturing a memory cell array. In each of FIGS. 34 to 42, the illustration (a) on the left-hand side is a cross-sectional view of data file cells, and the illustration (b) on the right-hand side is a cross-sectional view of code file cells. These cross-sectional views are taken along line A-A of FIG. 12 in the channel direction. According to the present invention, the code file portion and the data file portion can be designed to have the same array layout viewed in plan. Therefore, the present embodiment will be described with reference to the layout shown in FIG. 12.

First, an active region and device isolation regions are formed in the surface of a semiconductor substrate by a common shallow trench isolation (STI) process. It should be noted that these device isolation regions are not shown in the figures. Then, after exposing the silicon surface at the active region, the substrate surface is thermally oxidized to form a gate insulating film 900 having a thickness of 2.5 nm. After that, a polysilicon layer 500 is deposited to a thickness of 200 nm by a CVD technique. Then, after patterning the top surface by use of a select gate pattern (denoted by reference numeral 1500 in FIG. 12), the polysilicon layer is etched to form select gate electrodes 500, as shown in FIG. 34. Though not shown, the gate electrodes in the processing circuit portion (CPU) may be formed at the same time as the above select gate electrodes 500.

Then, after removing the portions of the gate insulating film 900 on the memory gate regions, the exposed substrate surfaces are oxidized to a depth of 4 nm. Then, by a CVD technique, a silicon nitride film is deposited on this oxide film to a thickness of 8 nm, and a silicon oxide film is deposited on the silicon nitride film to a thickness of 7 nm, forming an ONO film 950. It should be noted that the ONO film can also be formed by an in-situ steam generation (ISSG) oxidation technique. That is, the substrate surface is ISSG-oxidized to form an oxide film having a thickness of 5 nm. Then, a silicon nitride film is deposited on the top surface to a thickness of 14 nm and ISSG-oxidized to form an upper oxide film having a thickness of 6 nm.

After thus forming the ONO film 950, a polysilicon layer is deposited to a thickness of 70 nm. This polysilicon layer is doped with phosphorous to a high concentration in situ. This polysilicon layer is anisotropically etched to form a spacer-shaped memory gate 550 on a side of each select gate 500. At that time, the contact forming portions may be masked with a photoresist pattern. Though not shown, additional etching may be performed to remove unwanted portions of the polysilicon layer 550 from the sides of the select gates. According to the present embodiment, since the memory gates 550 are formed on only one side of each select gate 500, the unwanted portions of the polysilicon layer 550 are removed by etching, as shown in FIG. 35. At that time, the ONO film 950 can be used as a protective film for protecting the underlayer.

Then, a mask layer PR or a photoresist layer is formed, and arsenic is ion-implanted in the diffusion layer region on the memory gate side of each memory cell in the code file portion at 5 KeV to a dose amount of $10^{15}$ cm$^{-2}$ to form sources 201, as shown in FIG. 36.

Figure 37A:
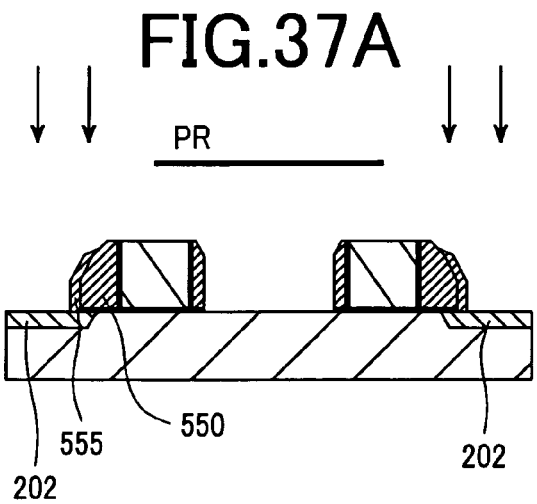
Figure 37B:
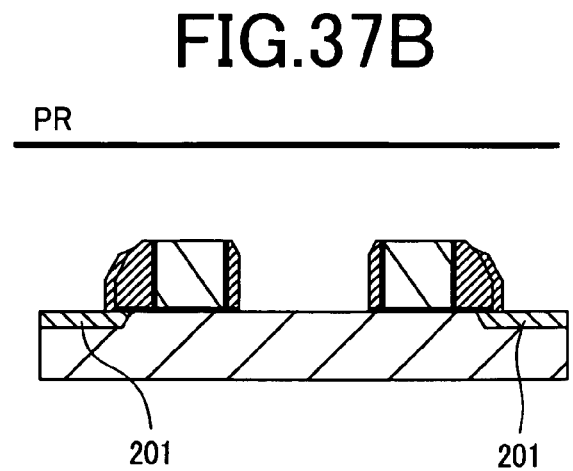

Then, after removing the oxide film on the silicon nitride film in the ONO film 950, a polysilicon layer is deposited to a thickness of 20 nm. This polysilicon layer is anisotropically etched to form a second spacer memory gate 555 on a side of each select gate 500 and a side of each memory gate 550, as shown in FIG. 37.

The exposed portions of the film stack made up of the silicon oxide film and the silicon nitride film are removed and then the substrate surface is thermally oxidized to form a silicon oxide film having a thickness of 2 nm. After performing patterning by use of a photoresist, arsenic is ion-implanted in the diffusion layer region on the memory gate side of each memory cell in the data file portion at 5 KeV to a dose amount of $10^{15}$ cm$^{-2}$ to form sources 202.

Figure 38A:
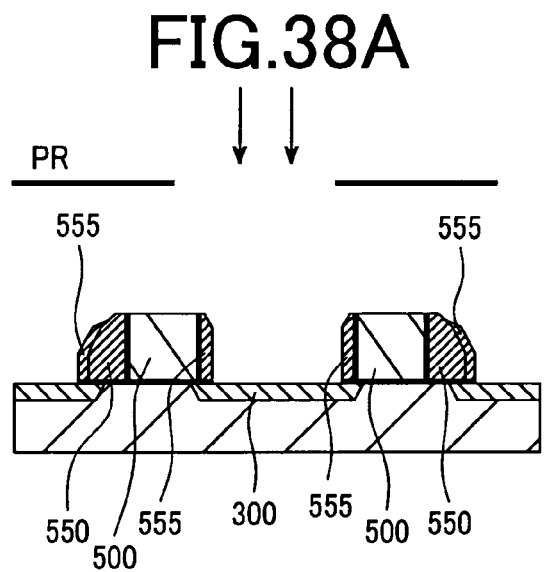
Figure 38B:
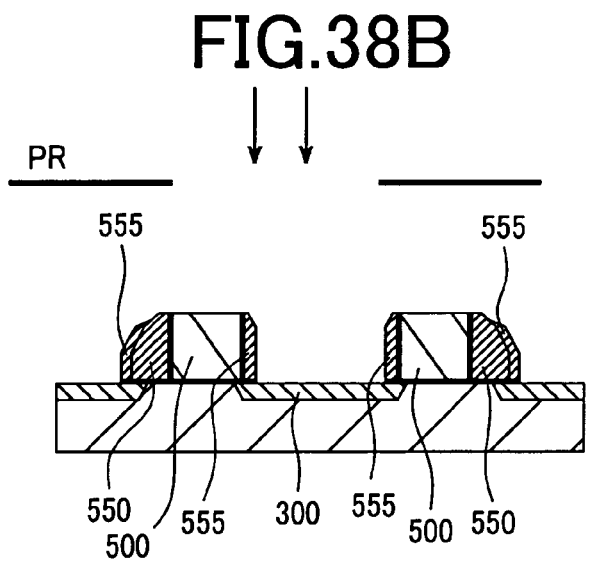

Then, a new mask layer PR or a photoresist layer is formed, and arsenic is ion-implanted in the diffusion layer region on the select gate side of each memory cell in the data file portion and the code file portion at 5 KeV to a dose amount of $10^{15}$ cm$^{-2}$ to form drains 300, as shown in FIG. 38.

Figure 39A:
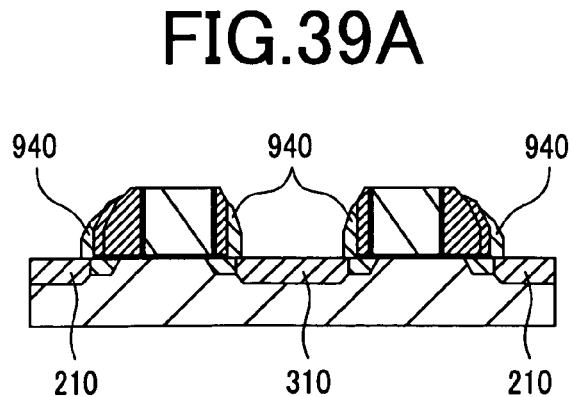
Figure 39B:
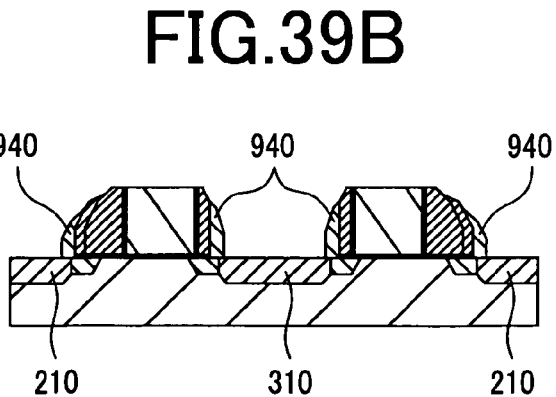

Then, a silicon oxide film is deposited on the top surface to a thickness of 80 nm. This silicon oxide film is anisotropically etched to form a spacer 940 on the second spacer memory gates 555 on each select gate 500 and each memory gate 550. Then, arsenic is ion-implanted using these spacers 940 as masks to form diffusion layers 210 and 310, as shown in FIG. 39. It should be noted that the select gates 500 may be doped with an impurity at the same time with the above impurity doping. These processes are common lightly-doped drain (LDD) processes.

Figure 40A:
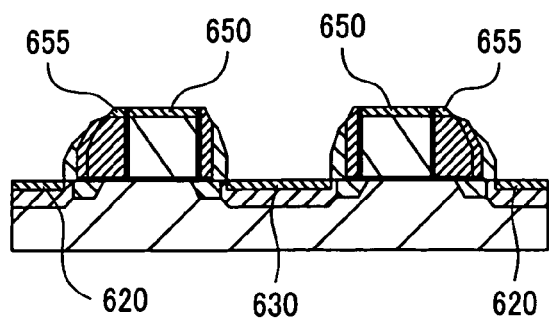
Figure 40B:
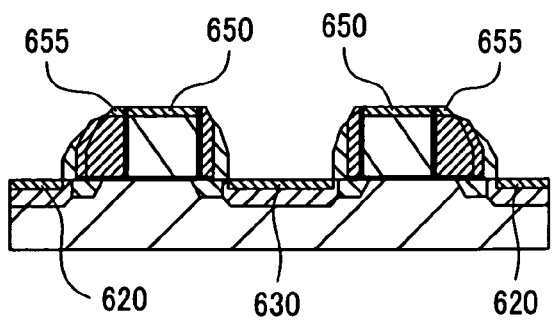

Then, silicide layers 650, 655, 620, and 630 are formed on the select gates, the memory gates, the source diffusion layers, and the drain diffusion layers, respectively, by a common salicide process, as shown in FIG. 40.

Figure 41A:
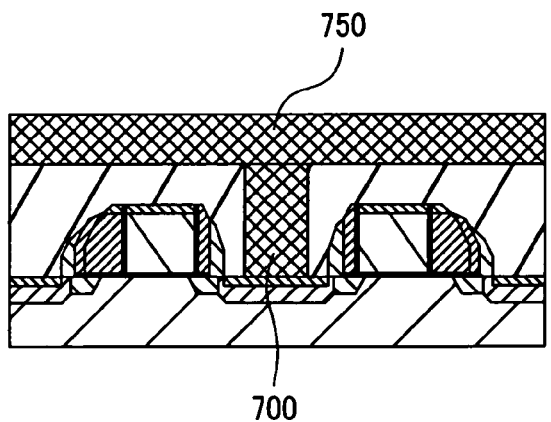
Figure 41B:
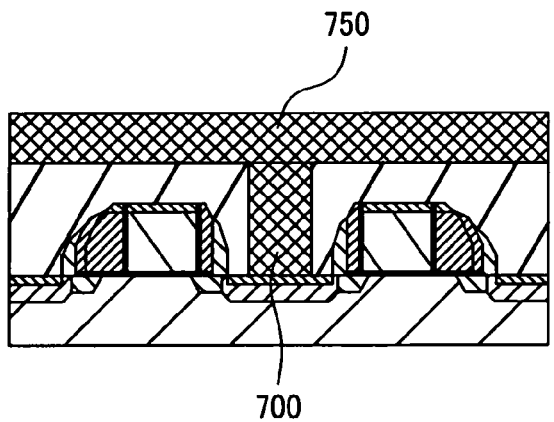

Then, a common wiring process for CMOS devices is used to complete the memory cells, as shown in FIG. 41. In FIG. 41, reference numeral 700 denotes a contact plug and 750 denotes a first metal wiring layer.

Figure 42:
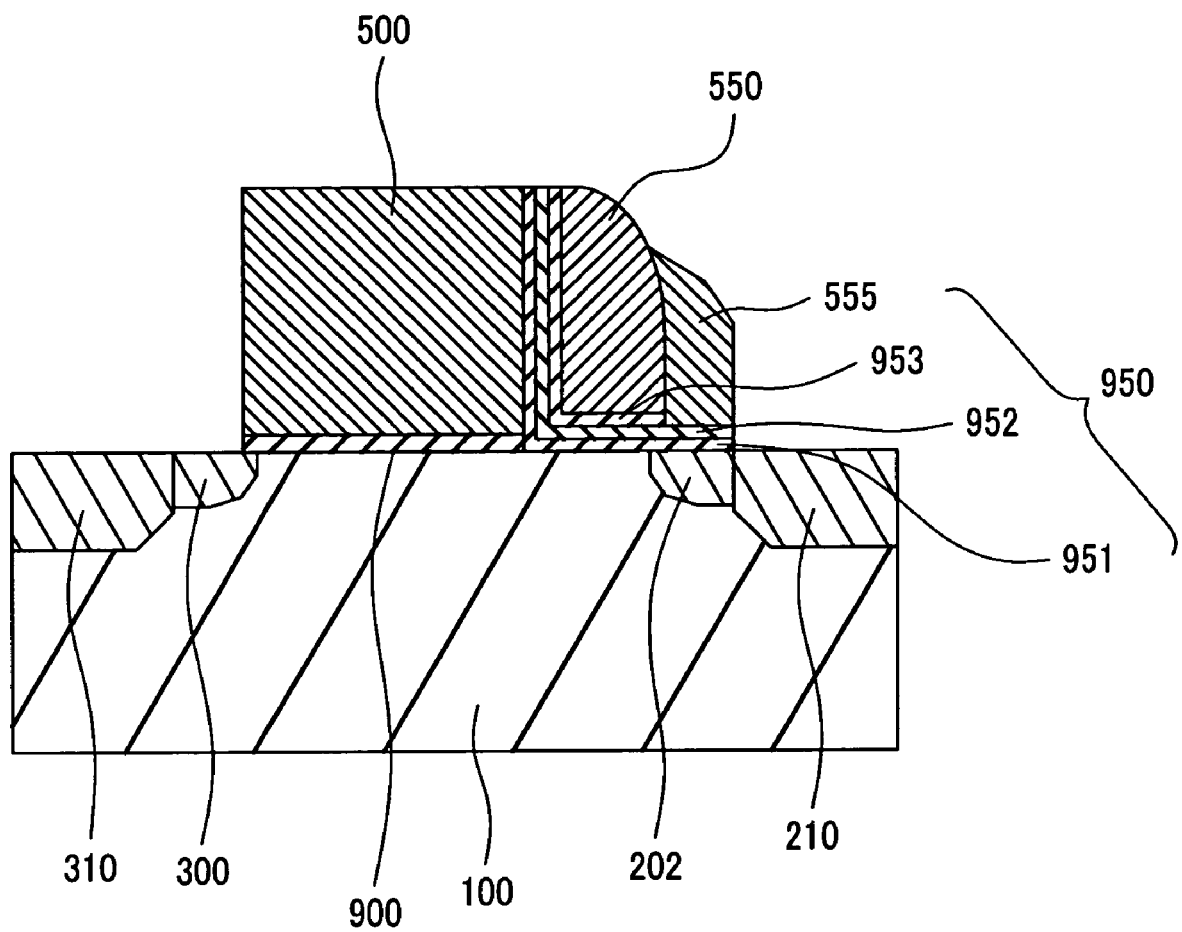
FIG. 42 is a cross-sectional structural view illustrating the effect of the third embodiment.

In each memory cell in the data file portion formed by the above manufacturing process, the overlap between the memory-gate-side diffusion layer 202 and the memory gate is covered by the second spacer memory gate 555, as schematically shown in FIG. 42. Referring to FIG. 42, the ONO film stack is made up of a silicon oxide film 951, a silicon nitride film 952, and a silicon oxide film 953. However, the film stack under the second spacer memory gate 555 only includes two layers: the silicon oxide film 951 and the silicon nitride film 952. This arrangement allows effectively reducing excessive charge injected into the insulating film on the diffusion layer and thereby preventing degradation in the programming/erase characteristics and retention characteristics.

Fourth Embodiment

The above manufacturing processes of the present invention concurrently form two types of memory arrays: a memory array read at high speed and a memory array read at lower speed. Therefore, these memory arrays may be modularized into modules each operated at a different clock frequency.

Figure 43:
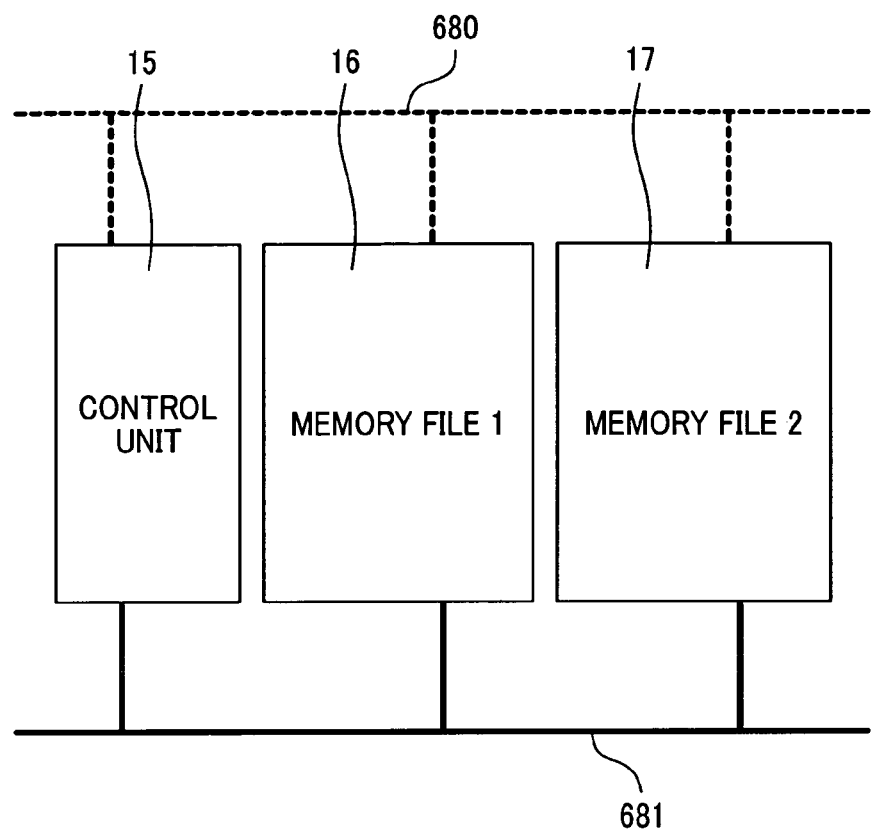
FIG. 43 is a diagram showing a memory file configuration.

FIG. 43 is a diagram showing the configuration of the major portion of modules according to a fourth embodiment of the present invention. In the figure, a control circuit 15, a memory file 1 (16), and a memory file 2 (17) are connected to one another through buses 680 and 681. If one of these memory files is a memory mat that is slow in read operation (or a data file), this slow memory file may be designed to deliver data to the bus 681 every two or more clock cycles.

Figure 44:
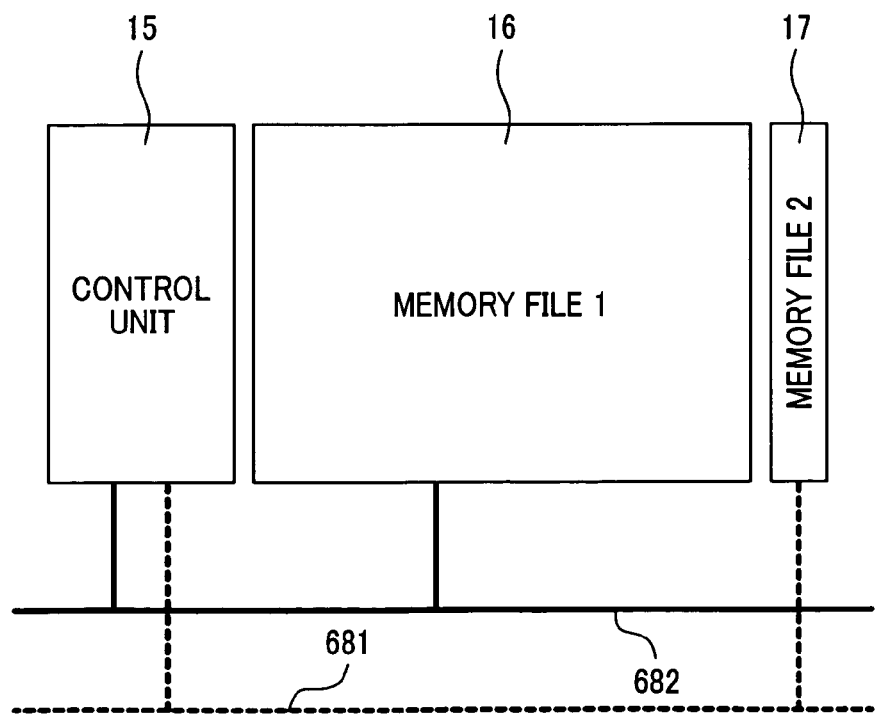
FIG. 44 is a diagram showing another memory file configuration.
Figure 45:
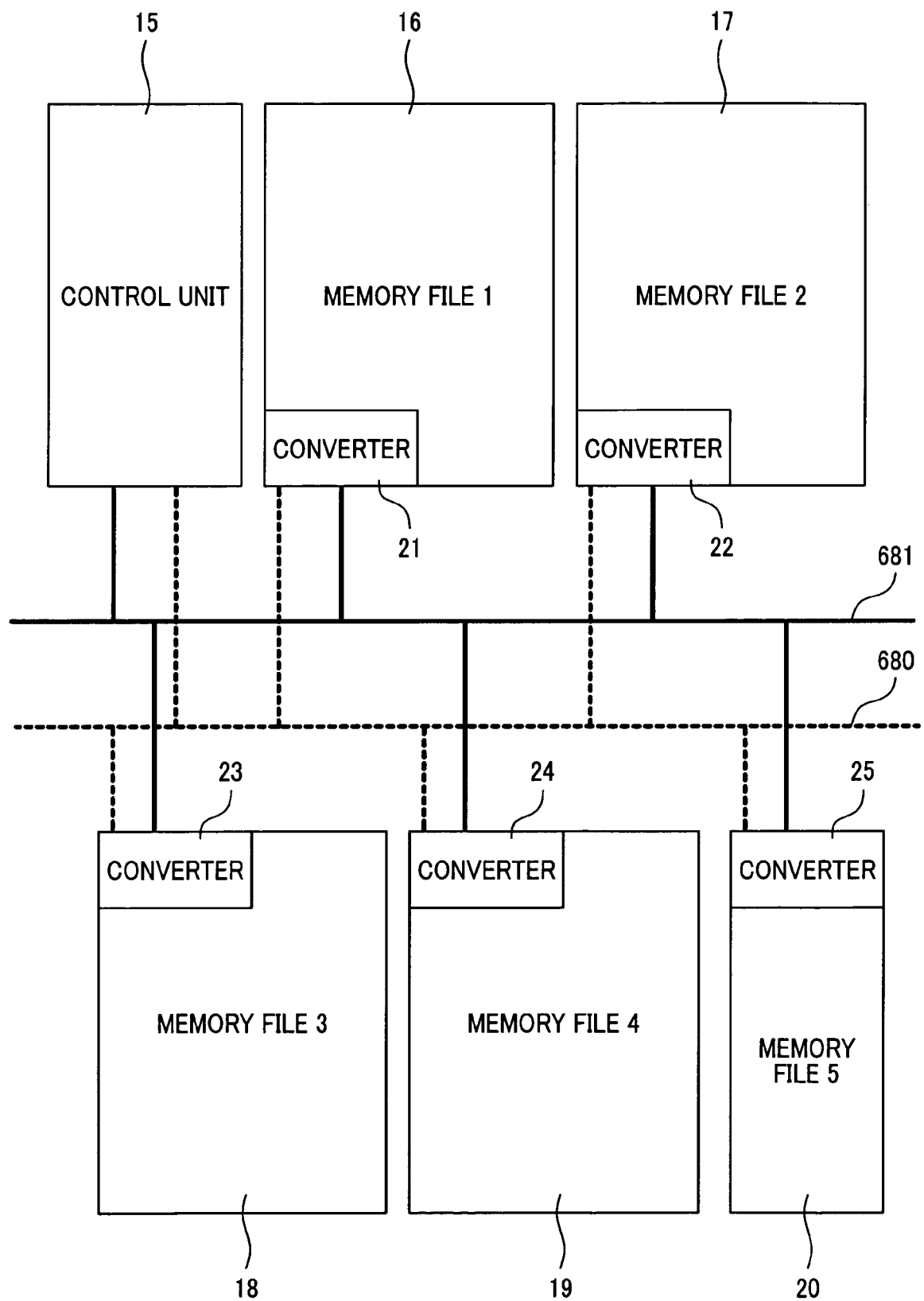
FIG. 45 is a diagram showing still another memory file configuration.

FIG. 44 shows another configuration. In the figure, a control circuit 15, a memory file 1 (16), and a memory file 2 (17) are connected to one another through buses 681 and 682. Since these buses operate at different frequencies, memory files can be operated at different speeds. FIG. 45 shows still another configuration. In this configuration, memory mats 16, 17, 18, 19, and 20 includes converters 21, 22, 23, 24, and 25, respectively. These memory mats are connected to a control circuit 15 through their respective converters and buses 680 and 681. The converters have a function to down-convert the clock signal on the bus 680. This allows a slow memory mat or mats to be operated at a frequency lower than the clock frequency, for example, half the clock frequency. That is, each memory mat can separately receive a suitable clock signal. Therefore, by using the above processes for forming memory cells having different channel lengths on the same chip, it is possible to produce integrated semiconductor devices that have the same memory mat configuration but employ different combinations of code files and data files.

Fifth Embodiment

Although the present invention has been described with reference to split-gate MONOS memory cells, the tradeoff described above, between reprogrammability and current drive, also occurs with floating-gate nonvolatile memory cells. Therefore, the gate length of floating-gate nonvolatile memory cells may be increased to achieve more stable controllability of the channel by the gate electrodes, even though this results in a reduced current drive. As a result, the amount of charge injected and released can be reduced, thereby increasing the number of times the memory cells can be reprogrammed. Therefore, integrating memory cells having different gate lengths on the same chip is also advantageous with floating-gate nonvolatile memory cells. Since the gate length of a floating gate depends on the layout size, the gate length can be changed by changing the layout. That is, if there is the above tradeoff in characteristics and the gate length depends on the layout size, the layout may be changed so as to integrate memory cells having different gate lengths on the same chip. For example, MONOS cells having different gate lengths can be integrated on the same chip, as shown in FIG. 42.

Figure 1A:
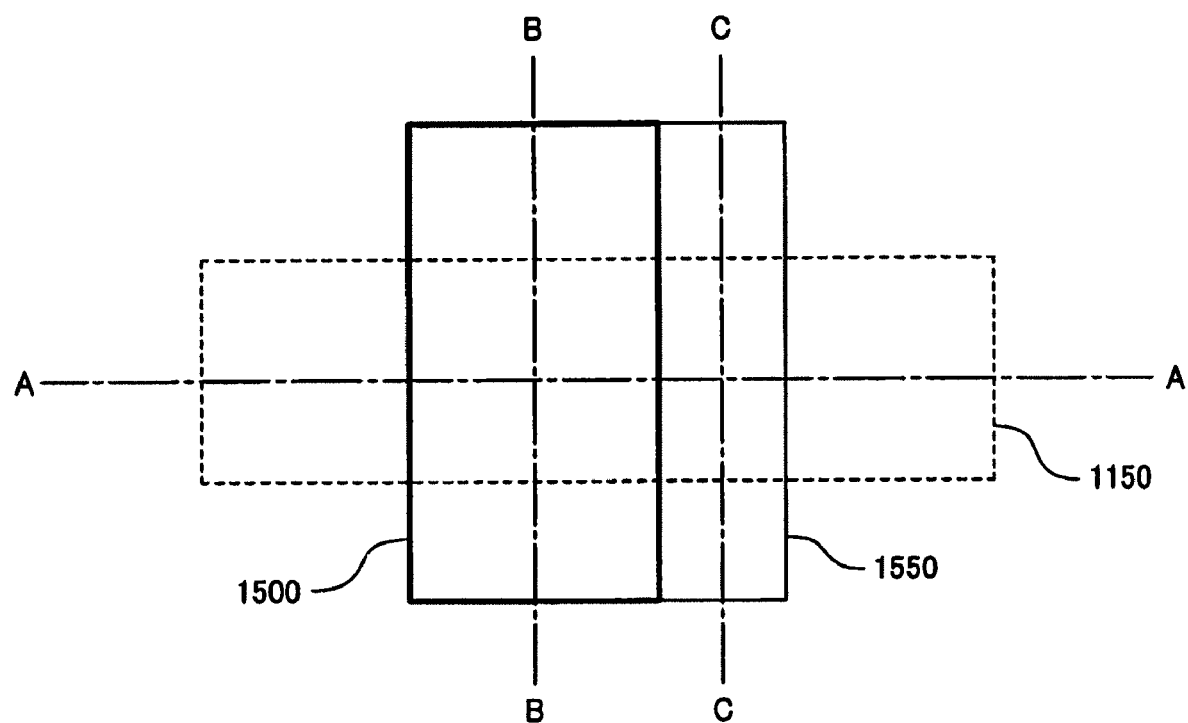
FIG. 1A is a plan view illustrating an exemplary layout of a split memory cell.
Figure 1B:
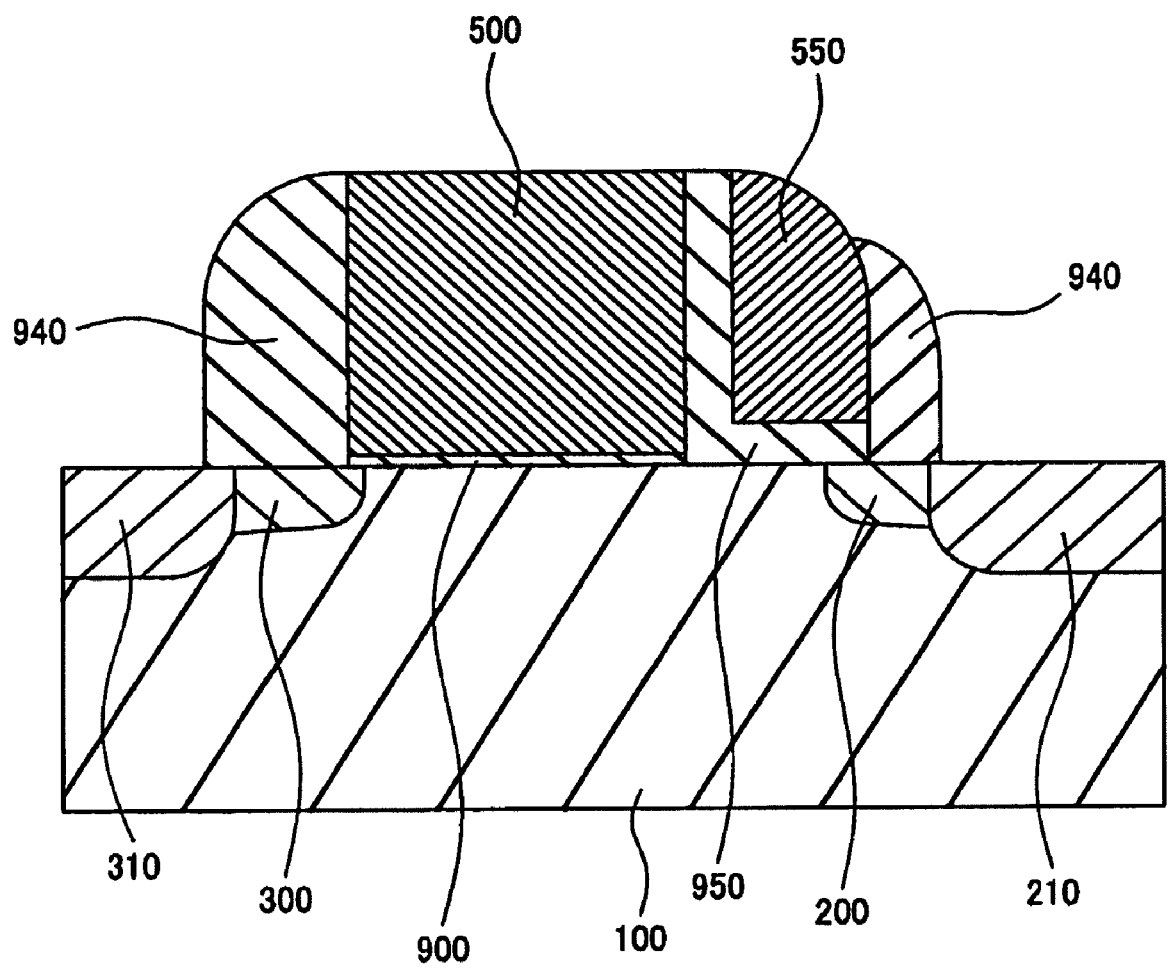
FIG. 1B is a cross-sectional view illustrating an exemplary structure of the split memory cell.
Figure 1C:
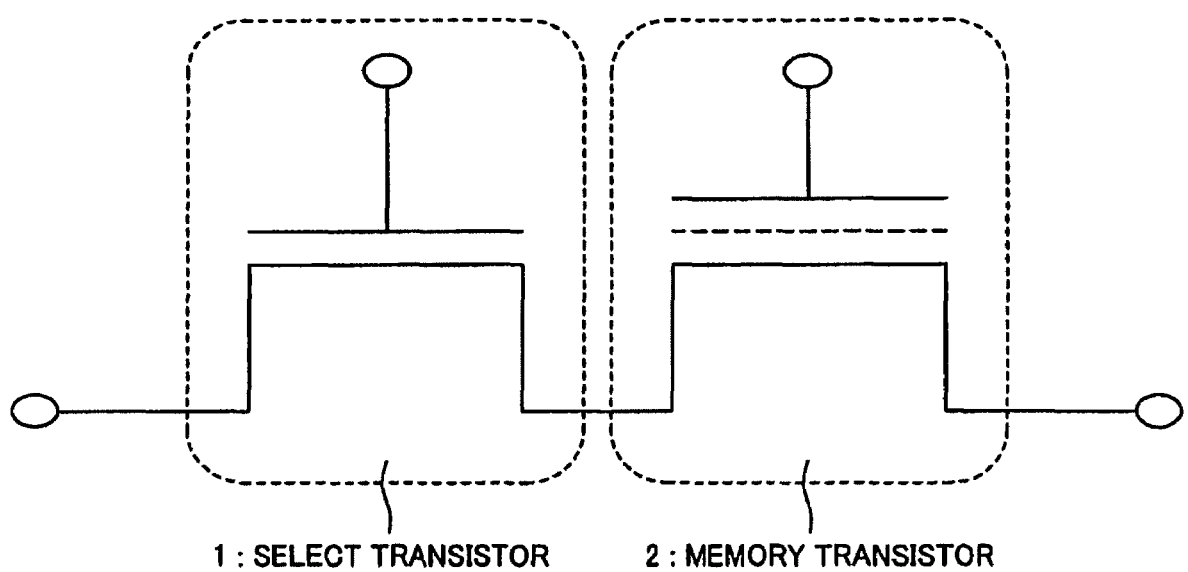
FIG. 1C is an equivalent circuit diagram of the split memory cell.
Figure 2:
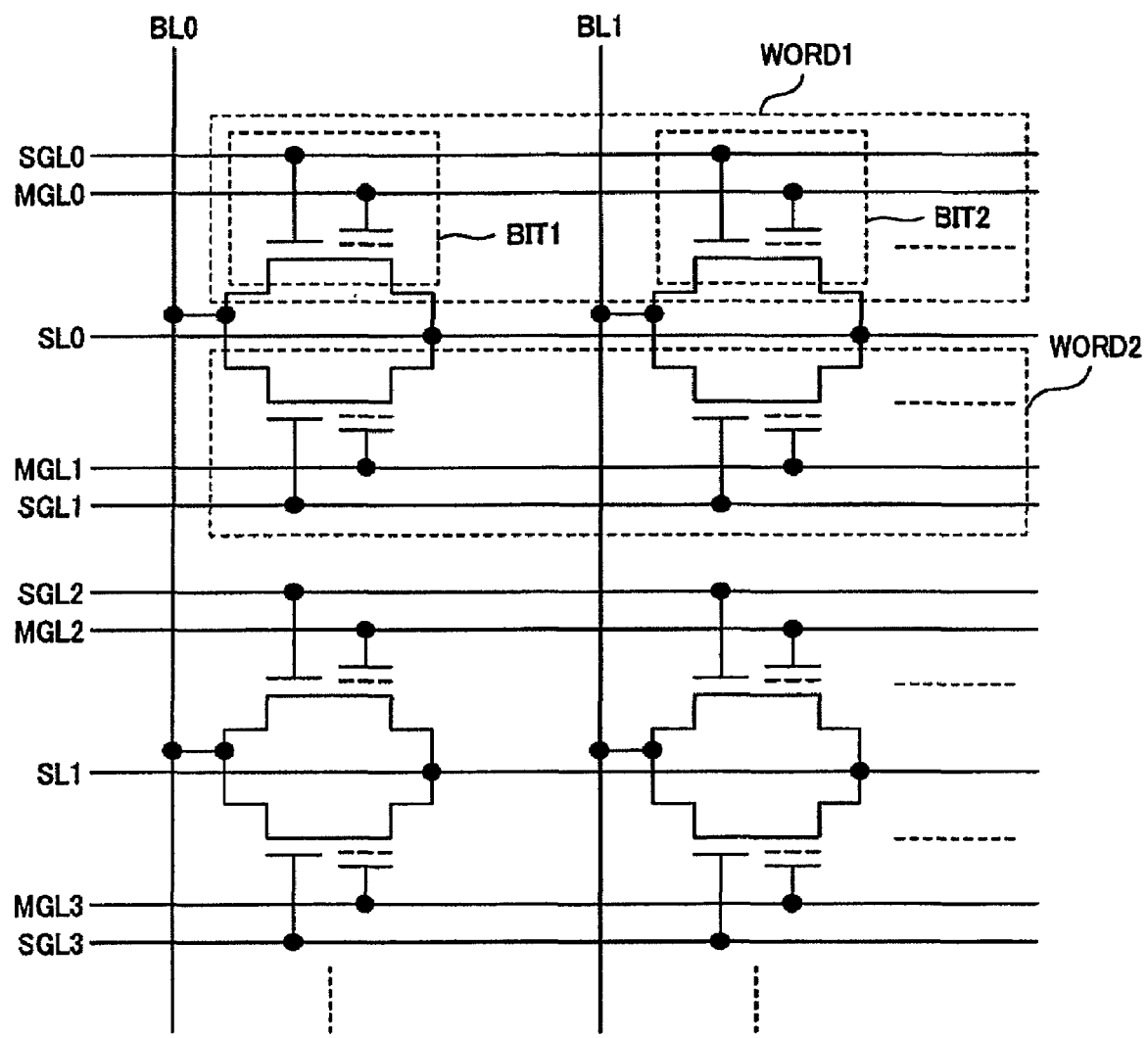
FIG. 2 is an equivalent circuit diagram of a memory array of split memory cells.
Figure 3:
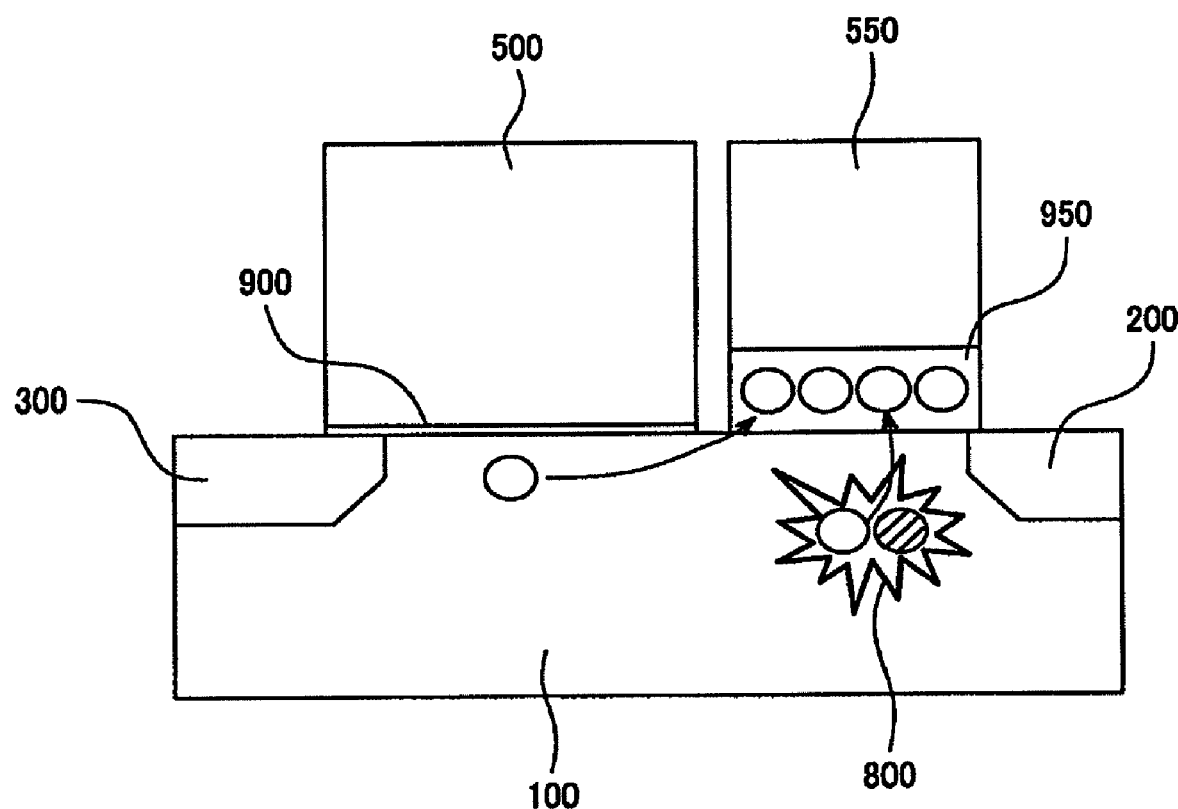
FIG. 3 is a schematic cross-sectional view illustrating a memory cell structure and a program operation.
Figure 4:
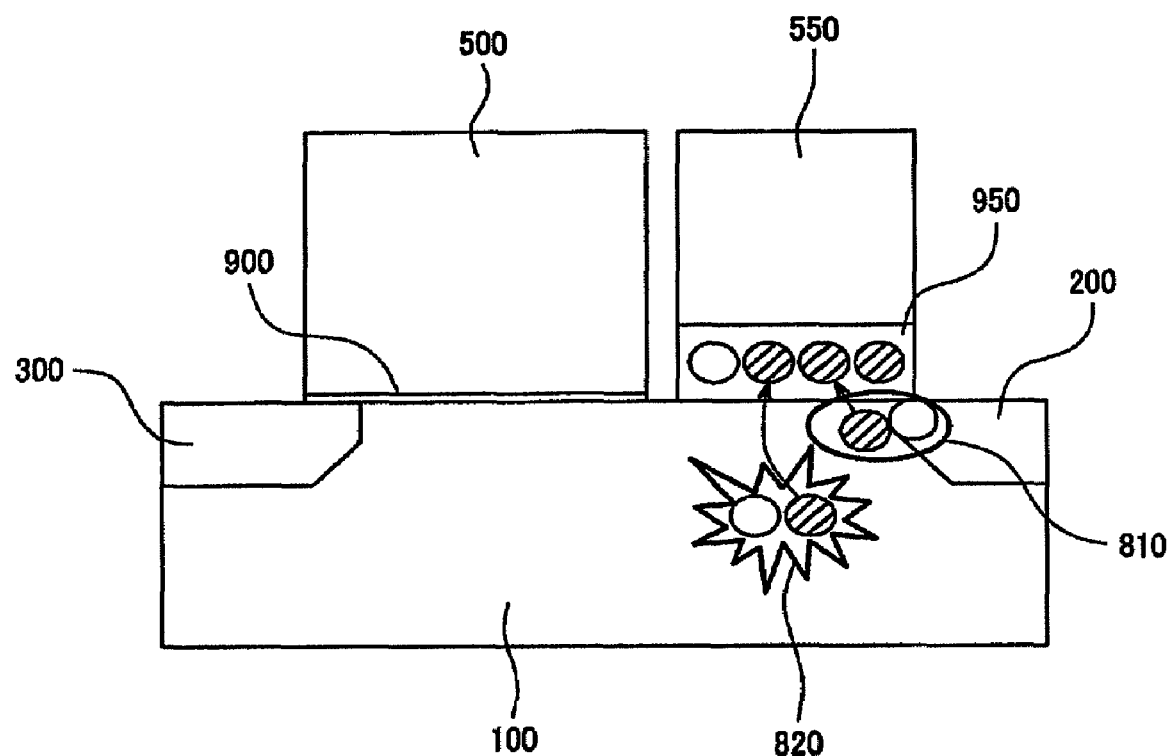
FIG. 4 is a schematic cross-sectional view illustrating a memory cell structure and an erase operation.
Figure 5:
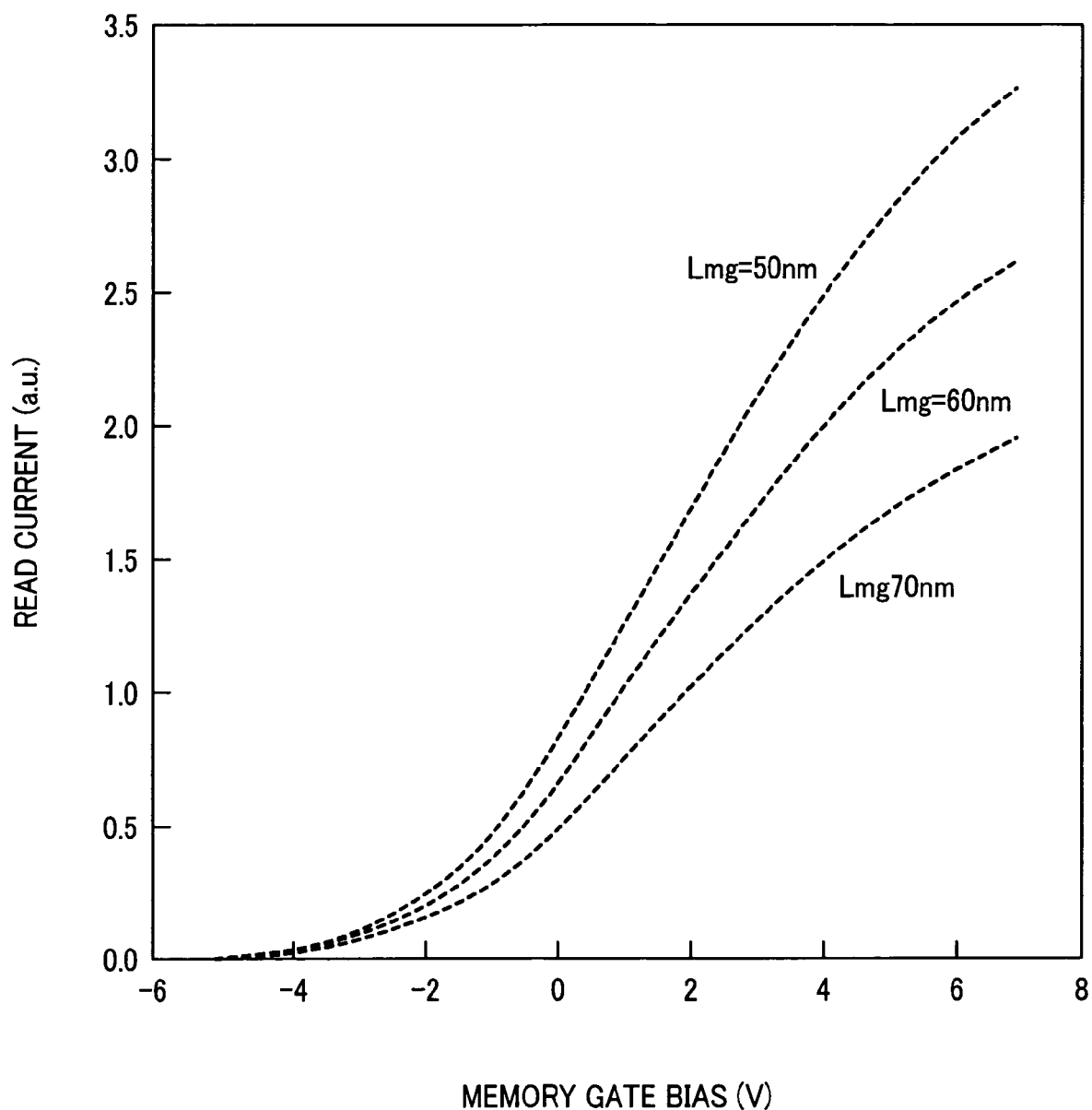
FIG. 5 is a current-voltage characteristic graph illustrating the dependence of a read current on the memory gate length.
Figure 6:
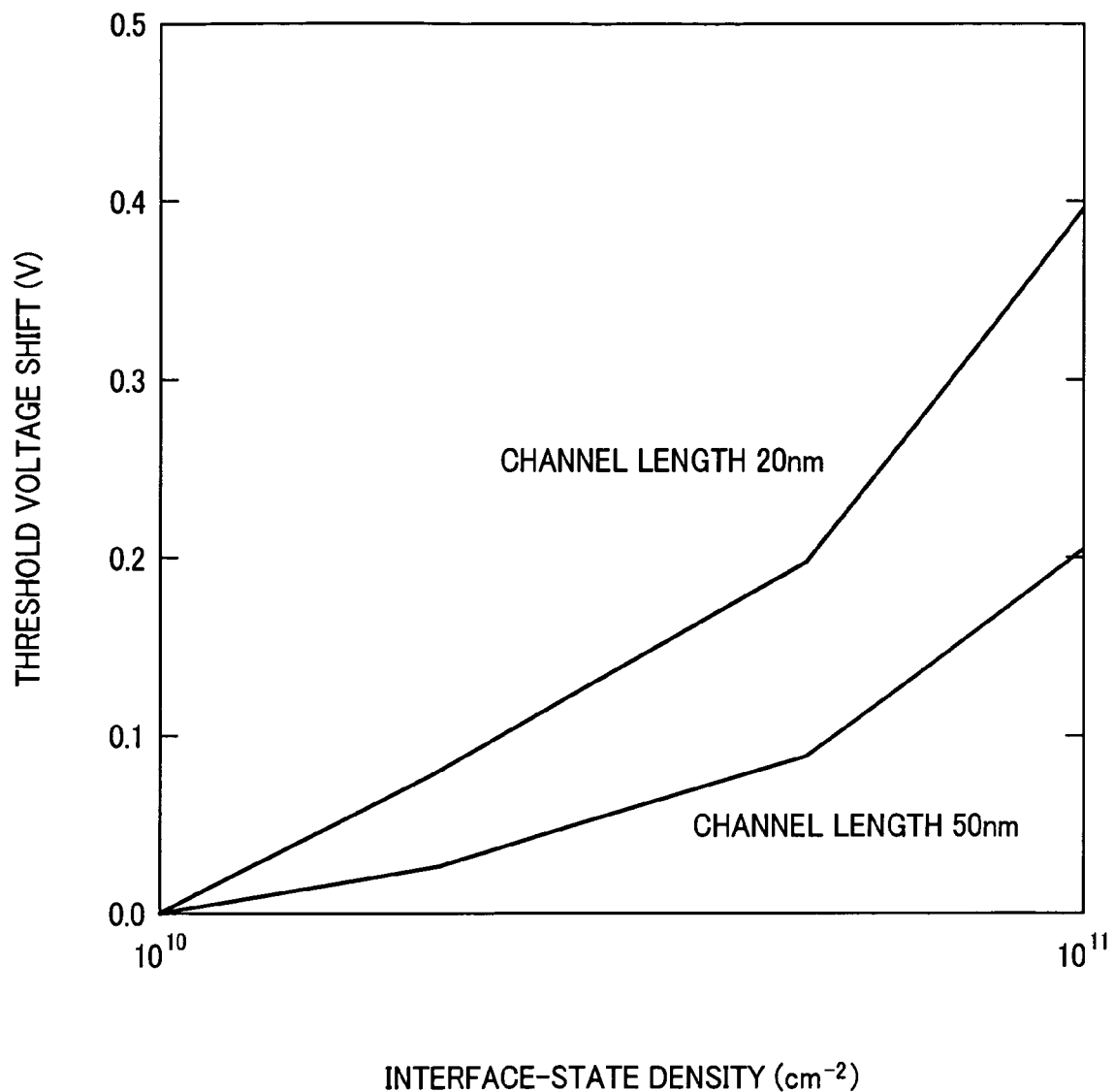
FIG. 6 is a graph illustrating the dependence of the change in threshold voltage on the memory gate length.
Figure 7:
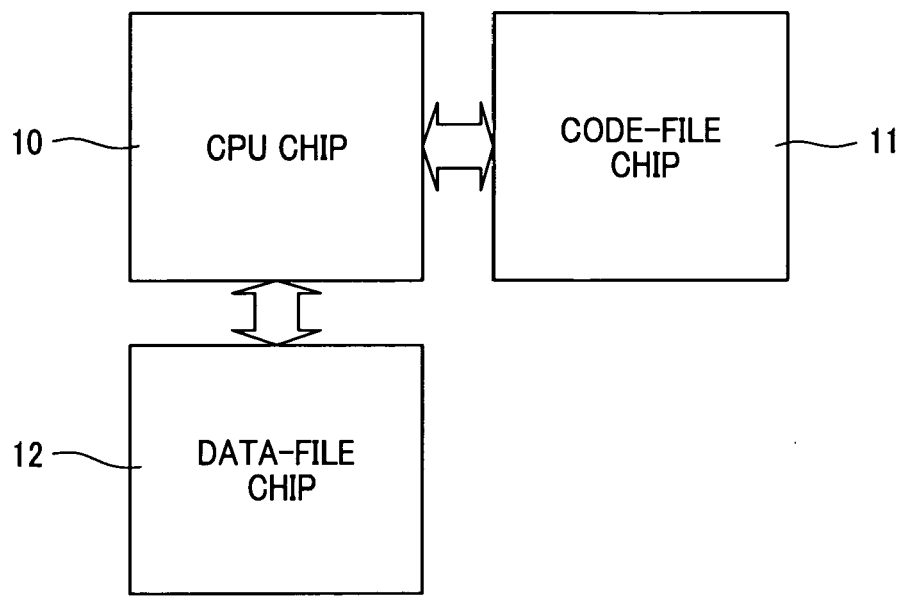
FIG. 7 is a diagram showing a chip configuration.
Figure 8:
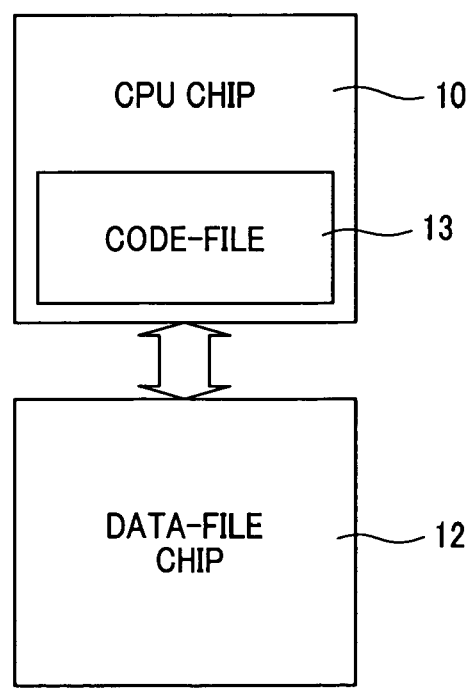
FIG. 8 is a diagram showing another chip configuration.
Figure 9:
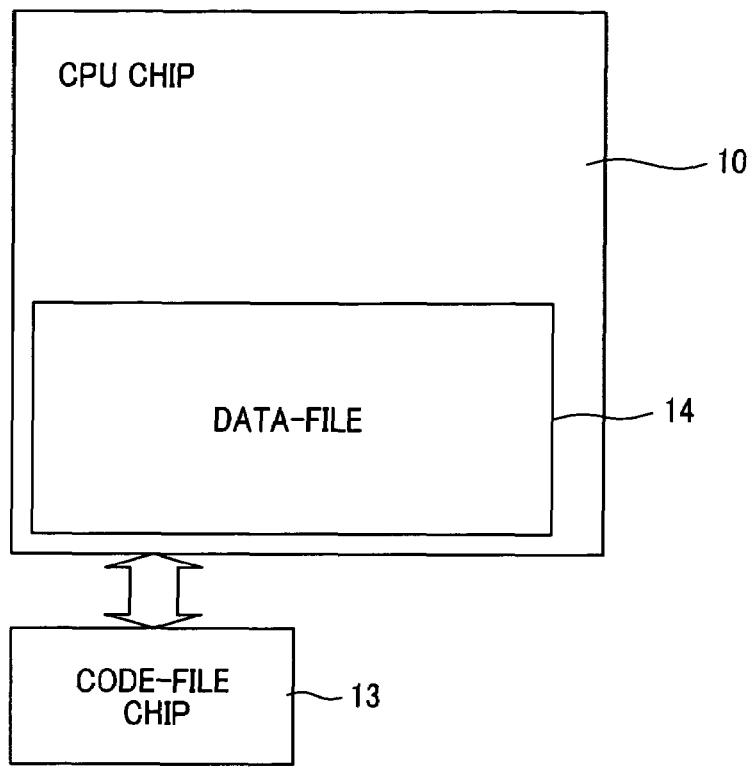
FIG. 9 is a diagram showing still another chip configuration.
Figure 46A:
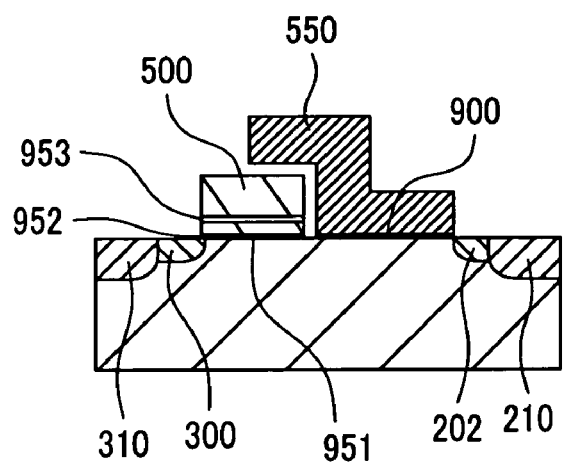
FIG. 46 is a cross-sectional view showing memory cells according to a fifth embodiment of the present invention.
Figure 46B:
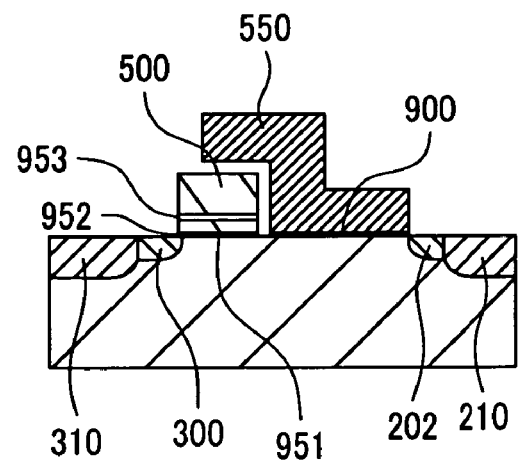

FIG. 46 shows memory cells obtained as a result of implementing the circuit diagram of FIG. 1C using a different manufacturing process than those described above. In FIG. 46, components common to the above figures are designated by the same reference numerals. Referring to FIG. 46, in each memory cell, the memory gate 550 is formed on the select gate 500 without using a spacer process. Specifically, the process for manufacturing a memory cell array according to a fifth embodiment of the present invention is characterized in that the following process steps are performed on both the data file portion and the code file portion: forming a silicon oxide film 951, a silicon nitride film 952, and a silicon oxide film 953 on a semiconductor substrate in that order; forming a select gate 500 on the silicon oxide film 953; forming an insulating film having a desired shape on the select gate 500; and forming a memory gate 550 having a desired shape. It should be noted that the dimensions of the memory and select gates are adjusted to meet the design requirements.

The present invention has been described with reference to various preferred embodiments. This invention can be used for various applications, since it enables an integrated semiconductor nonvolatile memory device to operate more stably than conventional integrated semiconductor nonvolatile memory devices. Specifically, according to the present invention, memory cells that must be read at high speed have a shorter memory gate channel length, while those that must be reprogrammed many times have a longer memory gate channel length. These fast and slow memory cells are integrated on the same chip to allow for both high-speed read operation and an increased number of reprogramming operations.

This completes the detailed description of the present invention. Listed below are the principal aspects of the present invention.

(1) A first aspect of the present invention provides an integrated semiconductor nonvolatile storage device comprising: a semiconductor substrate; and a plurality of semiconductor nonvolatile memory devices formed on the semiconductor substrate, each semiconductor nonvolatile memory device including at least an insulated gate field effect transistor having a charge retention portion therein; wherein one or more of the insulated gate field effect transistors have a different channel length than the other insulated gate field effect transistors.

(2) According to a second aspect of the present invention, the integrated semiconductor nonvolatile storage device of the first aspect (1) is further configured such that: each semiconductor nonvolatile memory device includes a first insulated gate field effect transistor and a second insulated gate field effect transistor formed on the silicon substrate, wherein the first and second insulated gate field effect transistors include a first gate and a second gate, respectively, and wherein the second insulated gate field effect transistor are formed parallel to and in contact with the first gate of the first insulated gate field effect transistor; each semiconductor nonvolatile memory device further includes a first diffusion layer electrode, a second diffusion layer electrode, a first channel, and a second channel all disposed in a direction perpendicular to the first and second gates, wherein the first channel is controlled by the first gate and the second channel is controlled by the second gate; the second insulated gate field effect transistor includes a gate insulating film having a charge retention function; and the second insulated gate field effect transistor is adapted such that a change in the amount of charge retained in the gate insulating film having the charge retention function results in a change in the relationship between the voltage of the second gate and the current flowing between the first and second diffusion layer electrodes of the second insulated gate field effect transistor.

(3) According to a third aspect of the present invention, the integrated semiconductor nonvolatile storage device of the second aspect (2) is further configured such that electrons and holes are injected into the gate insulating film of the second insulated gate field effect transistor so that a change in the amount of carrier charge retained in the gate insulating film results in a change in the relationship between the voltage of the second gate and the current flowing between the first and second diffusion layer electrodes of the second insulated gate field effect transistor, the gate insulating film having the charge retention function.

(4) According to a fourth aspect of the present invention, the integrated semiconductor nonvolatile storage device of the second aspect (2) is further configured such that the gate insulating film of the second insulated gate field effect transistor is a film stack made up of a silicon oxide film and a silicon nitride film.

(5) According to a fifth aspect of the present invention, the integrated semiconductor nonvolatile storage device of the second aspect (2) is further configured such that the second gate of the second insulated gate field effect transistor has a spacer structure using the first gate of the first insulated gate field effect transistor.

(6) According to a sixth aspect of the present invention, the integrated semiconductor nonvolatile storage device of the first aspect (1) is further configured such that the plurality of semiconductor nonvolatile memory devices have the same gate length.

(7) According to a seventh aspect of the present invention, the integrated semiconductor nonvolatile storage device of the first aspect (1) is further configured such that the plurality of semiconductor nonvolatile memory devices are arranged in a first memory mat and a second memory mat such that the semiconductor nonvolatile memory devices in the first memory mat have a shorter channel length than the semiconductor nonvolatile memory devices in the second memory mat.

(8) According to an eighth aspect of the present invention, the integrated semiconductor nonvolatile storage device of the seventh aspect (7) is further configured such that the semiconductor nonvolatile memory devices in the first memory mat are read at higher speed than the semiconductor nonvolatile memory devices in the second memory mat.

(9) According to a ninth aspect of the present invention, the integrated semiconductor nonvolatile storage device of the seventh aspect (7) is further configured such that the semiconductor nonvolatile memory devices in the second memory mat are reprogrammed a larger number of times than the semiconductor nonvolatile memory devices in the first memory mat.

What is claimed is:

1. An integrated semiconductor nonvolatile storage device comprising:
    a semiconductor substrate; and
    a plurality of semiconductor nonvolatile memory devices formed on said semiconductor substrate, each semiconductor nonvolatile memory device including a first storage portion to store information of a first type and a second storage portion to store information of a second type,
    wherein each said first storage portion and each said second storage portion includes a first insulated gate field effect transistor and a second insulated gate field effect transistor having a charge retention portion, and
    wherein, for each semiconductor nonvolatile memory device, a channel length of each said second insulated gate field effect transistor of the first storage portion is shorter than a channel length of each said second insulated gate field effect transistor of the second storage portion.

2. An integrated semiconductor nonvolatile storage device as claimed in claim 1,
    wherein a pair of said first and said second insulated gate field effect transistors include a first gate and a second gate, said first and second gates being disposed in a longitudinal direction parallel to each other, wherein each said first insulated gate field effect transistor includes a first diffusion layer electrode, a second diffusion layer electrode, and a first channel disposed perpendicular to the longitudinal direction of said first and second gates, said first channel being arranged between said first and second diffusion layer electrodes and controlled by said first gate,
    wherein each said second insulated gate field effect transistor includes a first diffusion layer electrode, a second diffusion layer electrode, and a second channel, all disposed perpendicular to the longitudinal direction of said first and second gates, said second channel being arranged between said first and second diffusion layer electrodes and controlled by said second gate,
    wherein said second insulated gate field effect transistor includes a gate insulating film having a charge retention function, and
    wherein said second insulated gate field effect transistor is adapted such that a change in an amount of charge retained in said gate insulating film having said charge retention function results in a change in a relationship between a voltage of said second gate and a current flowing between said first and second diffusion layer electrodes of said second insulated gate field effect transistor.

3. An integrated semiconductor nonvolatile storage device as claimed in claim 2,
    wherein electrons and holes are injected into said gate insulating film of said second insulated gate field effect transistor such that a change in an amount of carrier charge retained in said gate insulating film results in a change in said relationship between said voltage of said second gate and said current flowing between said first and second diffusion layer electrodes of said second insulated gate field effect transistor.

4. An integrated semiconductor nonvolatile storage device as claimed in claim 2, wherein said gate insulating film of said second insulated gate field effect transistor is a film stack comprised of a silicon oxide film and a silicon nitride film.

5. An integrated semiconductor nonvolatile storage device as claimed in claim 2,
wherein said first insulated gate field effect transistor includes a first insulating film formed on said semiconductor substrate, said first insulating film acting as a gate insulating film and having said first gate thereon,
wherein said second insulated gate field effect transistor includes a second insulating film having a first portion formed on a side of said first gate and a second portion formed on a region of a top surface of said semiconductor substrate, said second portion of said second insulating film having said second gate thereon and acting as a gate insulating film of said second insulated gate field effect transistor.

6. An integrated semiconductor nonvolatile storage device as claimed in claim 5,
wherein said second gate is formed on said second insulating film such that both of a side and a bottom of said second gate are in contact with said second insulating film, and
wherein a portion of said second insulating film is arranged between said first gate and said second gate.

7. An integrated semiconductor nonvolatile storage device as claimed in claim 1, wherein said second insulated gate field effect transistors of the first and second storage portions have the same gate length.

8. An integrated semiconductor nonvolatile storage device as claimed in claim 1, wherein said plurality of semiconductor nonvolatile memory devices are arranged in at least a first memory mat and a second memory mat such that the semiconductor nonvolatile memory devices of said first memory mat have a shorter channel length than the semiconductor nonvolatile memory devices of said second memory mat.

9. An integrated semiconductor nonvolatile storage device as claimed in claim 8, wherein said semiconductor nonvolatile memory devices of said first memory mat are read at higher speed than said semiconductor nonvolatile memory devices of said second memory mat.

10. An integrated semiconductor nonvolatile storage device as claimed in claim 8, wherein said semiconductor nonvolatile memory devices of said second memory mat are reprogrammed a larger number of times than said semiconductor nonvolatile memory devices of said first memory mat.

11. An integrated semiconductor nonvolatile storage device as claimed in claim 1,
wherein each said first insulated gate field effect transistor is a select transistor, and
wherein each said second insulated gate field effect transistor is a memory transistor.

12. An integrated semiconductor nonvolatile storage device as claimed in claim 1,
wherein the first type of information is code file information, and
wherein the second type of information is data file information.

13. An integrated semiconductor nonvolatile storage device as claimed in claim 1,
wherein the first storage portion operates at high speed relative to the second storage portion, and
wherein the second storage portion undergoes a large number of reprogramming operations relative to the first storage portion.

14. An integrated semiconductor nonvolatile storage device comprising:
a semiconductor substrate; and
a plurality of semiconductor nonvolatile memory components formed on said semiconductor substrate, said semiconductor nonvolatile memory components including first memory components each allocated for a first storage portion to store information of a first type and second memory components each allocated for a second storage portion to store information of a second type,
wherein each said semiconductor nonvolatile memory component includes a first insulated gate field effect transistor and a second insulated gate field effect transistor having a charge retention portion, and
wherein a channel length of the second insulated gate field effect transistor of each first memory component is shorter than a channel length of the second insulated gate field effect transistor of each second memory component.

15. An integrated semiconductor nonvolatile storage device as claimed in claim 14,
wherein a pair of said first and said second insulated gate field effect transistors include a first gate and a second gate, said first and second gates being disposed in a longitudinal direction parallel to each other,
wherein each said first insulated gate field effect transistor includes a first diffusion layer electrode, a second diffusion layer electrode, and a first channel disposed perpendicular to the longitudinal direction of said first and second gates, said first channel being arranged between said first and second diffusion layer electrodes and controlled by said first gate,
wherein each said second insulated gate field effect transistor includes a first diffusion layer electrode, a second diffusion layer electrode, and a second channel, all disposed perpendicular to the longitudinal direction of said first and second gates, said second channel being arranged between said first and second diffusion layer electrodes and controlled by said second gate,
wherein said second insulated gate field effect transistor includes a gate insulating film having a charge retention function, and
wherein said second insulated gate field effect transistor is adapted such that a change in an amount of charge retained in said gate insulating film having said charge retention function results in a change in a relationship between a voltage of said second gate and a current flowing between said first and second diffusion layer electrodes of said second insulated gate field effect transistor.

16. An integrated semiconductor nonvolatile storage device as claimed in claim 15,
wherein electrons and holes are injected into said gate insulating film of said second insulated gate field effect transistor such that a change in an amount of carrier charge retained in said gate insulating film results in a change in said relationship between said voltage of said second gate and said current flowing between said first and second diffusion layer electrodes of said second insulated gate field effect transistor.

17. An integrated semiconductor nonvolatile storage device as claimed in claim 15, wherein said gate insulating film of said second insulated gate field effect transistor is a film stack comprised of a silicon oxide film and a silicon nitride film.

18. An integrated semiconductor nonvolatile storage device as claimed in claim 15,
wherein said first insulated gate field effect transistor includes a first insulating film formed on said semiconductor substrate, said first insulating film acting as a gate insulating film and having said first gate thereon, wherein said second insulated gate field effect transistor includes a second insulating film having a first portion formed on a side of said first gate and a second portion formed on a region of a top surface of said semiconductor substrate, said second portion of said second insulating film having said second gate thereon and acting as a gate insulating film of said second insulated gate field effect transistor.

19. An integrated semiconductor nonvolatile storage device as claimed in claim 18, wherein said second gate is formed on said second insulating film such that both of a side and a bottom of said second gate are in contact with said second insulating film, and wherein a portion of said second insulating film is arranged between said first gate and said second gate.

20. An integrated semiconductor nonvolatile storage device as claimed in claim 14, wherein said second insulated gate field effect transistors of the first and second storage portions have the same gate length.

21. An integrated semiconductor nonvolatile storage device as claimed in claim 14, wherein each said first insulated gate field effect transistor is a select transistor, and wherein each said second insulated gate field effect transistor is a memory transistor.

22. An integrated semiconductor nonvolatile storage device as claimed in claim 14, wherein the first type of information is code file information, and wherein the second type of information is data file information.

23. An integrated semiconductor nonvolatile storage device as claimed in claim 14, wherein the first storage portion operates at high speed relative to the second storage portion, and wherein the second storage portion undergoes a large number of reprogramming operations relative to the first storage portion.

* * * * *